United States Patent
Tagami et al.

(10) Patent No.: US 9,238,314 B2
(45) Date of Patent: Jan. 19, 2016

(54) METHOD FOR RESIN MOLDING AND RESIN MOLDING APPARATUS

(71) Applicant: APIC YAMADA CORPORATION, Chikuma-shi, Nagano (JP)

(72) Inventors: Shusaku Tagami, Chikuma (JP); Yoshikazu Muramatsu, Chikuma (JP); Masanori Maekawa, Chikuma (JP); Hideaki Nakazawa, Chikuma (JP); Masahiko Fujisawa, Chikuma (JP); Takuya Miyamoto, Chikuma (JP)

(73) Assignee: APIC YAMADA CORPORATION, Chikuma-Shi (JP)

( * ) Notice: Subject to any disclaimer, the term of this patent is extended or adjusted under 35 U.S.C. 154(b) by 472 days.

(21) Appl. No.: 13/689,222

(22) Filed: Nov. 29, 2012

(65) Prior Publication Data

US 2013/0161879 A1    Jun. 27, 2013

(30) Foreign Application Priority Data

Dec. 27, 2011   (JP) .................................. 2011-284739

(51) Int. Cl.
- *B29C 33/68* (2006.01)
- *B29C 43/18* (2006.01)
- *H01L 21/56* (2006.01)

(52) U.S. Cl.
CPC .................. *B29C 43/18* (2013.01); *B29C 33/68* (2013.01); *H01L 21/566* (2013.01); *B29C 2043/181* (2013.01); *H01L 2924/0002* (2013.01)

(58) Field of Classification Search
CPC .. B29C 33/68; B29C 43/18; B29C 2043/181; H01L 21/566; H01L 2924/0002; H01L 2924/00

USPC ............................................................ 425/89
See application file for complete search history.

(56) References Cited

U.S. PATENT DOCUMENTS

| | | | | |
|---|---|---|---|---|
| 5,891,483 A | * | 4/1999 | Miyajima | ........................ 425/89 |
| 6,187,243 B1 | * | 2/2001 | Miyajima | ................ 264/272.15 |
| 6,511,620 B1 | | 1/2003 | Kawahara et al. | |
| 6,515,347 B1 | * | 2/2003 | Shinma et al. | ................. 257/620 |
| 7,153,116 B2 | * | 12/2006 | Tofukuji et al. | .................. 425/89 |
| 2002/0015748 A1 | | 2/2002 | Miyajima et al. | |

FOREIGN PATENT DOCUMENTS

| | | |
|---|---|---|
| EP | 0 759 349 A2 | 2/1997 |
| EP | 0 890 425 A1 | 1/1999 |
| EP | 0 933 808 A2 | 8/1999 |
| JP | 2000-277551 A | 10/2000 |
| JP | 2000 299334 A | 10/2000 |

\* cited by examiner

*Primary Examiner* — Robert B Davis
(74) *Attorney, Agent, or Firm* — Birch, Stewart, Kolasch & Birch LLP

(57) ABSTRACT

The method is capable of resin-molding one side face of a work in a molding die set, in which the work is sucked and held on at least one of clamping faces and resin-molded in a cavity concave section. The method comprises the steps of: sucking and holding a release film which covers at least one of the clamping faces of the molding die set; setting the work in the molding die set; sucking the other side face of the work through a work sucking hole of the release film, which is formed before or after holding the release film, so as to hold the work on the clamping face; closing the molding die set so as to clamp the work; and pressurizing and heating the resin, which has been accommodated in the cavity concave section, with resin.

8 Claims, 18 Drawing Sheets

METHOD FOR RESIN MOLDING AND RESIN MOLDING APPARATUS

CROSS-REFERENCE TO RELATED APPLICATION

This application is based upon and claims the benefit of priority of the prior Japanese Patent Application No. P2011-284739 filed on Dec. 27, 2011 and the entire contents of which are incorporated herein by reference.

FIELD

The present invention relates to a method for resin molding and a resin molding apparatus, in each of which a release film is provided on at least a work mounting face of a clamping face of a molding die set, the molding die set is put into a clamping state, and the work including its periphery is resin-molded therein.

BACKGROUND

The applicant invented a resin molding apparatus in which an elongated release film easily peelable from a molding die set and resin is used. In the resin molding apparatus, the release film, which is wound on a reel, is supplied to a space between a clamping face of an upper die and a clamping face of a lower die, and the release film is sucked. And then, a work is mounted on the clamping face of the lower die together with the release film, the resin is supplied onto the work, a substrate part of the work is clamped by clampers, and the work is compression-molded (see Japanese Laid-open Patent Publication No. 2000-277551).

By employing the above described resin molding apparatus, no resin fins are formed in the molding die set and no resin contaminates the clamping faces, so that a molded product can be easily removed from the clamping faces.

In some works, devices are formed close to outer edges of a substrate (e.g., wafer) for mass production.

In this case, the substrate cannot be clamped by, for example, the clampers, so it is difficult to correctly position and set the work in the molding die set. Especially, in case of using the release film, the release film is sucked and held on the clamping face, but the work is merely mounted on the release film. Therefore, the work cannot be correctly positioned and held there, and warpage of the work, which is caused by difference of thermal expansion coefficients between the work and the die, cannot be prevented.

Further, the outer edges of the work are included in a resin molding range, so a contact area between the work and the release film held on the clamping face is large. If the release film is not peeled from the molded product, it is difficult to smoothly take out the molded product from the molding die set.

SUMMARY

Accordingly, it is objects to provide a method for resin molding and a resin molding apparatus, each of which is capable of solving the above described problems of the conventional technology. Namely, the method and apparatus of the present invention are capable of correctly positioning and holding a work on a clamping face of a molding die set and easily removing a molded product, whose periphery is resin-molded, from the molding die set.

To achieve the object, the present invention has following structures.

Namely, in the method of the present invention, one side face of a work is resin-molded in a molding die set, which resin-molds the work in a clamping state and in which the work is sucked and held on at least one of clamping faces and resin-molded in a cavity concave section whose outside dimension is larger than that of the work.

The method comprises the steps of:

sucking and holding a first release film which covers at least one of the clamping faces of the molding die set;

setting the work in the molding die set;

sucking the other side face of the work through a work sucking hole of the first release film, which is formed before or after holding the first release film, so as to hold the work on the clamping face;

closing the molding die set so as to clamp the work; and pressurizing and heating the resin, which has been accommodated in the cavity concave section.

In the method, the other side face of the work is sucked through the work sucking hole of the release film, which covers one of the clamping faces and held thereon, so that the work can be correctly positioned and held on the clamping face and resin-molded without contaminating the clamping face on which the work is held.

On the other hand, the resin molding apparatus of the present invention resin-molds one side face of a work in a molding die set, which resin-molds the work in a clamping state and in which the work is sucked and held on at least one of clamping faces and resin-molded in a cavity concave section whose outside dimension is larger than that of the work.

The resin molding apparatus comprises:

the molding die set including a film sucking hole, which is formed in at least one of the clamping faces, a work drawing hole, which is separated from the film sucking hole and which is communicated with a work sucking hole of the release film when the release film is sucked and held, and a cavity concave section, into which resin for molding the work is supplied;

a conveying unit for conveying the work into the molding die set so as to suck the other side face of the work through the work sucking hole of the release film and hold the work on one of the clamping faces, and taking out the molded product from the molding die set; and a peeling unit for peeling the release film, which has stuck on the molded product, from the molded product after the molding die set is opened.

In the resin molding apparatus, the molding die set is opened, and then the release film stuck on the molded product is removed. Even if the periphery of the work (the molded product) is resin-molded, the release film, which has stuck on the other side face of the work, can be peeled from the molded product, by the peeling unit, with applying tension to the release film, after opening the molding die set. Therefore, the molded product can be smoothly taken out from the molding die set.

The work sucking hole may be formed in the first release film, by a hole-forming jig, after the first release film is sucked and held on one of the clamping faces.

For example, the work sucking hole is formed, by inserting a needle of the hole-forming jig into a work drawing hole formed in a work mounting face, in the molding die set.

With this structure, the work sucking hole, which is separated from the film sucking hole, can be securely formed in the state where the first release film is sucked and held on the clamping face.

The hole-forming jig may include a guide cylinder, which guides reciprocation of the needle, and the guide cylinder may press the first release film while the work sucking hole is formed by inserting the needle into the work drawing hole.

With this structure, slack and break of an inner edge of the work sucking hole can be prevented, and the work sucking hole can be formed without drawing of the first release film caused by the reciprocation of the needle.

The first release film having the work sucking hole may be sucked and held on one of the clamping faces, and a second release film may be sucked and held on the other clamping face, in which the cavity concave section is formed.

With this structure, the work mounting face is covered with the first release film and the cavity concave section is covered with the second release film. So, even if the both side faces of the work are resin-molded, no resin contacts the molding die set, so that the molding die set can be easily cleaned.

Setting the work may be guided by a guide member, which is projected from a work mounting face formed in one of the clamping faces, and the guide member may be retracted from the work mounting face when the molding die set clamps the work.

With this structure, the guide member guides the periphery of the work, so that the work can be mounted on the work mounting face and sucked and held thereon. Further, by retracting the guide member from the work mounting face, the periphery of the work can be resin-molded.

The work and the resin may be conveyed to the molding die set by a loader, the loader may be correctly positioned with respect to one of the clamping face, and the loader may set the work onto a work mounting face.

With this structure, the loader can be correctly positioned with respect to one of the clamping face and can set the work onto the work mounting face, so that the work can be correctly set and positioned in the molding die set.

The first release film, which has stuck on the molded product, may be removed by a peeling bar, which is moved parallel to the work, in a state where the first release film covering a work mounting face is sucked and held on the clamping face and the molded product is held and lifted from the work mounting face by an off-loader.

With this structure, the first release film, which has stuck on the molded product whose periphery is resin-molded, can be compulsorily removed, by the peeling bar, with applying tension to the first release film. Therefore, the molded product can be easily taken out from the molding die set.

The first release film, which has stuck on the molded product, may be removed by a peeling bar, which is moved parallel to the work, in a state where tension is applied to the first release film covering a work mounting face by winding actions of an elongated feed reel and an elongated collecting reel.

With this structure, by previously applying the tension to the first release film stuck on the molded product, the first release film is inflected by moving the peeling bar, so that the first release film can be easily peeled from the molded product.

The first release film, which covers a work mounting face and has stuck on the molded product, may be removed by a peeling chuck, which holds and moves the first release film away from the work, in a state where the molded product is held and lifted from the work mounting face by an off-loader.

In this case, preferably a product receiving table is inserted under the work before the first release film is removed by the peeling chuck. Falling the molded product from the off-loader can be prevented when the first release film is removed from the molded product.

By employing the resin molding method and the resin molding apparatus of the present invention, even if the work is mounted with the release film, the work can be correctly positioned and securely held on the clamping face. Further, the molded product whose periphery is resin-molded, can be easily removed from the molding die set.

BRIEF DESCRIPTION OF THE DRAWINGS

Embodiments of the present invention will now be described by way of examples and with reference to the accompanying drawings, in which.

DETAILED DESCRIPTION OF THE EMBODIMENTS

Preferred embodiments of the resin molding apparatus and the resin molding method relating to the present invention will now be described in detail with reference to the accompanying drawings. In the following embodiments, a compression molding apparatus will be explained as an example of a resin molding apparatus of the present invention. Further, a semiconductor wafer will be explained as a work to be resin-molded.

Firstly, a schematic structure of the resin molding apparatus (compression molding apparatus) will be explained with reference to FIGS. 1-3. In the compression molding apparatus, the molding die set is put into a clamping state and one side face of the work including periphery (peripheral faces) is resin-molded.

Figure 1:
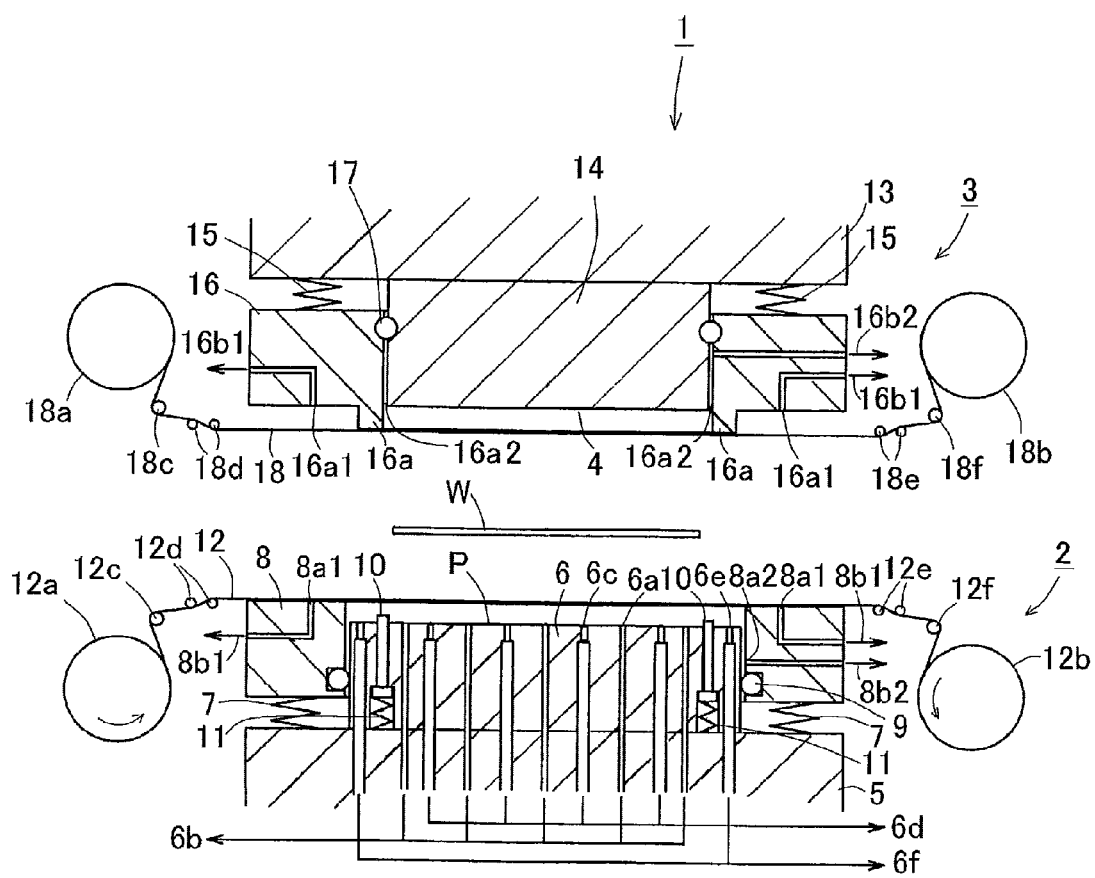
FIG. 1 is a sectional view of a resin molding apparatus.

In FIG. 1, a work W will be sucked and held on a clamping face of a lower die 2 (a lower clamping face) of a molding die set 1, and a cavity concave section 4, whose outside dimension is larger than that of the work W, is formed in a clamping face of an upper die 3 (an upper clamping face). In the present embodiment, the lower die 2 is a movable die and fixed to a movable platen; the upper die 3 is a fixed die and fixed to a fixed platen. As shown in FIG. 2, an open/close mechanism of the resin molding apparatus is capable of adjusting inclination of the lower die 2 (i.e., parallelism between the lower die 2 and the upper die 3). Therefore, even if the work W is a large semiconductor wafer, the work W can be molded with uniform thickness.

Figure 2:
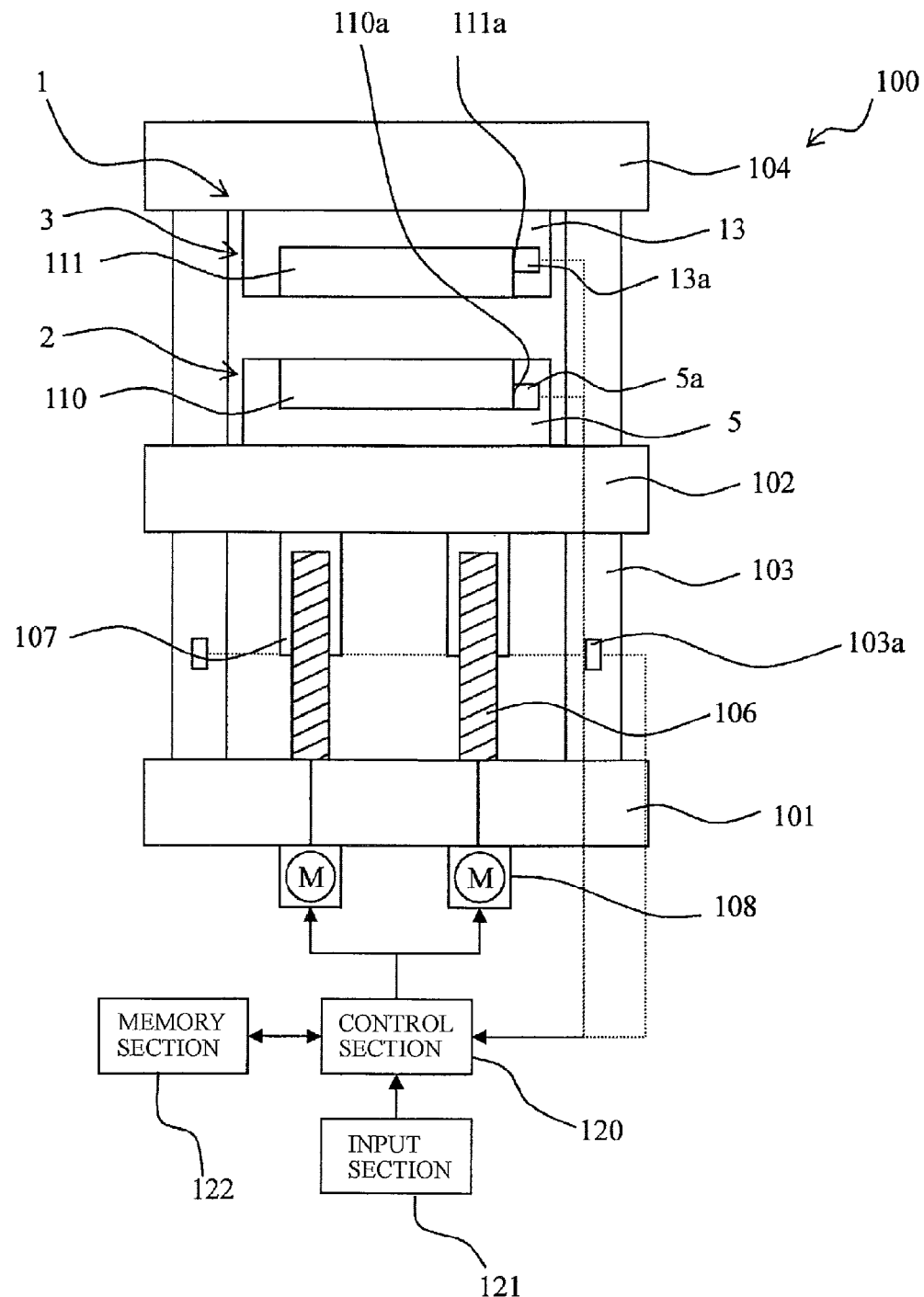
FIG. 2 is an explanation view of an open/close mechanism of a molding die set.

Concretely, as shown in FIG. 2, the resin molding apparatus 100 of the present embodiment has a press section, in which a plurality of pressing means (e.g., four pressing means) having ball bearing screws 106 are provided between a base plate 100 and the movable platen 102. The press section includes a plurality of tie bars (e.g., four tie bars 103), which are provided to four corners of a board section 101 and extended upward. The fixed platen 104 is fixed to upper ends of the tie bars 103. The movable platen 102 is slidably attached to the tie bars 103. Pressure sensors 103a (means for detecting pressure) are respectively provided to the tie bars 103. The pressure sensors 103a measure pressures applied to the tie bars 103 when the resin molding action (open and close actions of the dies) is performed. Output signals of the pressure sensors 103a are used for controlling pressurizing means when pressure difference is occurred by clamping action of the dies.

The upper die 3 is fixed to the fixed platen 104. The upper die 3 includes an upper chase 111, which can be exchanged according to, for example, packages to be molded, and an upper base 13, which accommodates the upper chase 111. A die ID 111a, which can be read externally, is provided on a surface of the upper chase 111. An ID reader 13a is provided to the upper base 13. The ID reader 13a reads the die ID 111a of the upper chase 111 and sends the ID to a control section 120. On the other hand, the lower die 2 facing the upper die 3 is fixed to the movable platen 102. The lower die 2 includes a lower chase 110, which can be exchanged according to, for example, packages to be molded, and a lower base 5, which accommodates the lower chase 110. A die ID 110a, which can be read externally, is provided on a surface of the lower chase 110. An ID reader 5a is provided to the lower base 5 as well as the upper base 13. The ID reader 5a reads the die ID 110a of the lower chase 110 and sends the ID to the control section 120.

The ball bearing screws 106 are rotatably erected from the board section 101 and arranged parallel to the tie bars 103. The ball bearing screws 106 are respectively located at apexes of an imaginary quadrangle similar to an imaginary quadrangle whose apexes correspond to the tie bars 103. Further, the ball bearing screws 106 are located on diagonal lines of the imaginary quadrangle whose apexes correspond to the tie bars 103. Upper parts of the ball bearing screws 106 are respectively screwed with nut sections 107 provided to a bottom face of the movable platen 102. The ball bearing screws 106 are respectively rotated, in the normal direction and the reverse direction, by servo motors 108 controlled by the control section 120, so that vertical motion and inclination of the movable platen 102 can be controlled. Namely, the ball bearing screws 106, the nut sections 107 and the servo motors 108 constitute pressurizing means capable of pressing the movable platen 102 toward the fixed platen 104 with adjusting the inclination of the movable platen 102 with respect to the fixed platen 104. Note that, the movable platen 102 is vertically moved by the servo motors 108, so a moving speed of the movable platen 102 can be optionally controlled. Therefore, for example, a moving speed of a flow front of resin spread in the molding die set can be made constant by controlling the moving speed of the movable platen 102, and the moving speed of the movable platen 102 can be controlled in response to degree of solidification of the resin.

For example, in case of firstly using a predetermined combination of the dies, the lower chase 110 and the upper chase 111 are respectively set in the lower base 5 and the upper base 13, and then the ID readers 5a and 13a respectively read the die IDs 110a and 111a and send the IDs to the control section 120. At that time, a test work W is resin-molded, as a test operation, and thickness variation of the molded work W is measured at optional positions so as to calculate a correction amount of the thickness of the resin mold (an amount of molding offset). Note that, thickness variation of the molded work W is caused by thicknesses of the dies, a thickness of the movable platen 102, etc. Therefore, the correction amount for each combination of the dies must be required.

Next, when the correction amount is inputted through an input section 121, the control section 120 calculates correction values for amounts of rotating the ball bearing screws 106 (correction values of the ball bearing screws 106), on the basis of the correction amount of the thickness of the resin which molds the work W, and stores the correction values in a memory section 122. For example, an amount of rotating each of the ball bearing screws 106 (i.e., the correction value) and the corresponding die IDs 110a and 111a are stored in the memory section 122 so as to previously rotate each of the ball bearing screws 106 a predetermined amount to uniform the thickness of the resin which molds the work W. At that time, the correction values of the ball bearing screws 106 are calculated on the basis of the correction amount of the thickness of the resin which molds the work W and the size of the work W. For example, the inclination of the movable platen 102 is adjusted by amounts of rotating the ball bearing screws 106, so even if the correction values of the ball bearing screws 106 are equal, the correction amount of the thickness of the resin which molds the work W is increased in proportion to an outside dimension (size) of the work W. Therefore, the correction amount of the thickness of the resin which molds the work W and the correction values of the ball bearing screws 106 for each outside dimension of the work W are previously prepared, so that the correction can be securely performed with a simple structure. Next, the control section 120 drives the ball bearing screws 106 on the basis of the correction values, so that the parallelism of the lower die 2 with respect to the upper die 3 can be corrected and thickness variation of the molded work W can be highly reduced. In the following resin-molding operations, the ball bearing screws 106 are uniformly driven to open and close the dies 2 and 3, so that the thickness of the resin which molds the work W can be uniformed. By previously driving the ball bearing screws 106 on the basis of the correction values before clamping the work W, the molding operation can be easily controlled without adjusting the thickness of the resin while clamping the work W. Further, forming resin flashes and breaking the work W in the clamping step can be prevented.

In case of reusing a prescribed combination of the dies in the resin molding apparatus 100, the correction values of the ball baring screws 106 can be read from the memory section 122, so that the resin molding apparatus 100 can be easily set up and working efficiency can be improved. Namely, in the following resin-molding operations, the correction values corresponding to the die IDs 110a and 111a can be read from the memory section 122, on the basis of signals indicating the die IDs 110a and 111a which are outputted when the upper chase 111 and the lower chase 110 are set in the molding die set, and used. Therefore, the ball bearing screws 106 are driven on the basis of the read correction values, so that a step of setting the correction values can be omitted when the dies are set, the working efficiency can be improved and operational errors can be prevented.

Note that, the correction values of the ball bearing screws 106 are stored for each combination of the lower chase 110 and the upper chase 111, so that frequent exchange of the chases can be easily performed. The correction values of the ball bearing screws 106 may be stored for each combination of: the lower die 2 including the lower base 5; and the upper die 3 including the upper base 13. By reading the die IDs 110a and 111a provided on the surfaces of the lower and upper chases 110 and 111 with the ID readers 5a and 13a, resetting the correction values of the ball bearing screws 106 can be omitted and input errors can be prevented. Note that, the correction values of the ball bearing screws 106 may be inputted, on the basis of the combination of the dies, through the input section 121.

Next, details of the molding die set 1 will be explained with reference to FIGS. 1-3.

The lower die 2 includes a lower block 6, which is fixed on the lower base 5, and a lower clamper 8, which encloses the lower block 6 and which is floating-supported by coil springs 7. An O-ring 9 is provided between sliding faces of the lower block 6 and the lower clamper 8 so as to seal a gap therebetween. A work mounting section is formed on an upper face of the lower block 6. A thickness of the work W is absorbed by a level difference between the work mounting section and an upper face of the lower clamper 8.

Film sucking holes 6a are opened in the upper face of the lower block 6, and a film sucking path 6b is communicated with the film sucking holes 6a. Work drawing holes 6c, which are separated from the film sucking holes 6a, are opened in the upper face of the lower block 6, and a work drawing path 6d is communicated with the work drawing holes 6c. An inner diameter of the work drawing holes 6c is smaller than that of the work drawing path 6d. With this design, extension of a release film, which is caused when needles of a hole-forming jig forms holes in the release film, can be prevented.

Pressure reduction holes 6e are opened in outer edge parts of the upper face of the lower block 6 so as to reduce an inner pressure of a cavity concave section. A pressure reduction path 6f is communicated with the pressure reduction holes 6e.

The film sucking path 6b, the work drawing path 6d and the pressure reduction path 6f are formed in the lower block 6 and the lower base 5 and respectively communicated with pressure reduction units (not shown).

A guide member 10 for guiding outer periphery of the work W is capable of projecting and retracting from a work mounting face P (the upper face of the lower block 6) so as to correctly position the work W. In FIG. 1, the guide member 10 is always biased, by springs 11 provided between the guide member 10 and the lower base 5, so as to project from the upper face of the lower block 6. The guide member 10 may be projected and retracted, by other driving means, e.g., cylinder unit, solenoid, instead of the springs 11, for guiding and positioning the work W.

Film sucking holes 8a1 are opened in an upper face of the lower clamper 8, and film sucking paths 8b1 are communicated with the film sucking holes 8a1. Further, a film sucking hole 8a2 is opened in an inner face of the lower clamper 8, which faces the lower block 6, and a film sucking path 8b2 is communicated with the film sucking hole 8a2. The film sucking holes 8a1 are communicated with a circular groove, which is separated a prescribed distance from an inner edge of the lower clamper 8, so that the release film 12 can be sucked by the entire lower clamper 8.

A lower release film (a first release film) 12 is sucked and held on the lower clamping face. The lower release film 12 is an elongated film, which is fed from a feed reel 12a to the clamping face of the lower die 2 and collected on a collecting reel 12b. Cores of the feed roll 12a and the collecting roll 12b are respectively rotated in a normal direction and a reverse direction by driving sources (not shown).

The lower release film 12 fed by the feed roll 12a is supplied onto the lower clamping face via a guide roller 12c and tension rollers 12d, and wound (collected) on the collecting roll 12b via tension rollers 12e and a guide roller 12f. The tension rollers 12d and the tension rollers 12e can be moved upward and downward, so that tension applied to the lower release film 12 can be adjusted according to diameters of the feed roll 12a and the collecting roll 12b.

By moving the lower die 2 upward, the lower release film 12 is sucked toward the film sucking holes 6a, 8a1 and 8a2 opened in the lower clamping face, so that the lower release film 12 covering the lower clamping face is sucked and held thereon. The work W is sucked and held on the lower clamping face in a state where the work drawing holes 6c of the upper block 6 are respectively communicated with the work sucking holes 12g bored in the lower release film 12.

The release film 12 is easily peelable from the surface of the die and made of a soft and extensible material having enough heat resistance, e.g., PTFE, ETFE, PET, FEP, glass cloth including fluorine, polypropylene, polyvinylidene chloride.

The upper die 3 includes an upper block 14, which is fixed to the upper base 13, and an upper clamper 16, which encloses the upper block 14 and which is suspended from the upper base 13 by coil springs 15. An O-ring 17 is provided between sliding faces of the upper block 14 and the upper clamper 16 so as to seal a gap therebetween. A bottom face of the upper block 14 acts as an inner ceiling face of the cavity concave section 4. An inner part of the clamping face of the upper clamper 16 is projected downward as a projecting section 16a. The cavity concave section 4 is formed by the level difference between the projecting section 16a and the upper block 14. By closing the molding die set 1, the projecting section 16a of the upper clamper 16 contacts the upper face of the outer part of the lower block 6 together with an upper release film (a second release film) 18 and the lower release film 12, so that the upper clamper 16 and the lower clamper 8 can bite each other together with the release films 12 and 18 (see FIG. 6B). Further, an air vent groove (not shown) is formed in a bottom face of the projecting section 16a and corresponded to the pressure reduction path 6f. The air vent groove has a prescribed depth for discharging air only, so that pressure can be reduced in the clamping state.

Film sucking holes 16a1 are opened in the clamping face of the upper clamper 16, and film sucking paths 16b1 are communicated with the film sucking holes 16a1. Further, a film sucking hole 16a2 is opened an in inner face of the upper clamper 16, which faces an outer face of the upper block 14, and a film sucking paths 16b2 is communicated with the film sucking holes 16a2.

The upper release film (the second release film) 18 is sucked and held on the upper clamping face. The upper release film 18 is an elongated film, which is fed from a feed roll 18a to the clamping face of the upper die 3 and collected on a collecting roll 18b. Cores of the feed roll 18a and the collecting roll 18b are respectively rotated in a normal direction and a reverse direction by driving sources (not shown).

The upper release film 18 fed by the feed roll 18a is supplied onto the upper clamping face via a guide roller 18c and tension rollers 18d, and wound on the collecting roll 18b via tension rollers 18e and a guide roller 18f. The tension rollers 18d and the tension rollers 18e can be moved upward and downward, so that tension applied to the upper release film 18 can be adjusted according to diameters of the feed roll 18a and the collecting roll 18b.

The upper release film 18 is sucked, through the film sucking holes 16a1 and 16a2, in a state where tension is applied to the upper film 18 between the tension rollers 18d and the tension roller 18e, so that the upper release film 18 covers the upper clamping face including the cavity concave section 4 and is held thereon. The upper release film 18 is easily peelable from the surface of the die and made of a soft and extensible material having enough heat resistance, as well as the lower release film 12.

Figure 3:
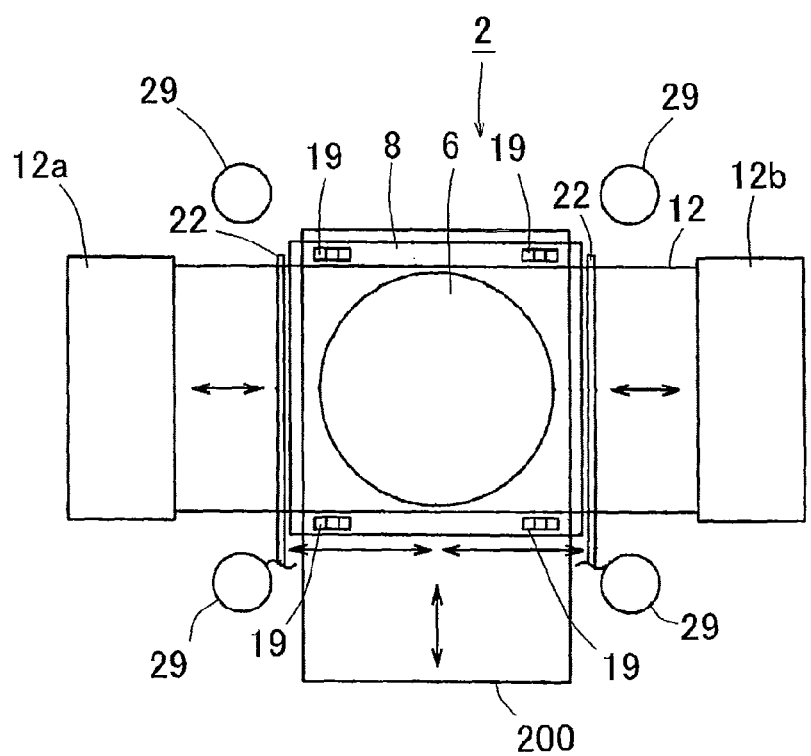
FIG. 3 is a plan view of a lower die, into which a loader is moved.

In FIG. 3, lower lock blocks 19 are respectively provided to four corners of the lower clamper 8 in the lower clamping face so as to correctly position with respect to the upper block 14. Upper lock blocks (not shown) are provided on the upper clamping face of the upper clamper 16 and capable of biting with the lower lock blocks 19. Note that, as shown in FIG. 3, guide posts 29 are provided to four corners of the lower die 2. The guide posts 29 connect the platens, to which the lower and upper dies 2 and 3 are fixed, to each other, and guides the vertical movement of the movable platen 102.

Note that, the structure of the lower die 2 and the upper die 3 of the molding die set 1 may be inverted. Namely, the upper die 3 may suck and hold the work W together with the upper release film 18 covering the upper block 14. In this case, resin 24 is supplied into the cavity concave section which is constituted by the lower block 6 and the lower clamper 8. Further, the film sucking holes are formed in the upper clamping face of the upper block 14, the work sucking holes are formed in the upper release film 18, and the work drawing holes, which are communicated with the work sucking holes, are formed in the upper block 14.

A conveying section 200, which includes a loader 20 (see FIG. 5) and an off-loader 21 (see FIG. 8) for conveying the work W to and from the molding die set 1, is correctly positioned with respect to the lower lock block 19, so that the work W can be transferred onto the work mounting face P (the upper face of the lower block 6, see FIG. 1). The loader 20 conveys the work W to the molding die set 1 so as to suck the work W through the work sucking holes 12g of the lower release film 12 and hold the work W on the lower clamping face (see FIG. 6A). The off-loader 21 takes out a molded product 25 from the molding die set 1 (see FIG. 10).

In FIG. 3, a pair of peeling bars 22 (peeling means) are located on the both sides of the lower block 6 in the feeding direction of the lower release film 12. The peeling bars 22 are capable of moving parallel to the lower clamping face. After the molding die set 1 is opened, the peeling bars 22, which are located on the both sides of the lower block 6, are upwardly moved until reaching predetermined positions above the lower block 6 in a state where tension is applied to the lower release film 12 which has stuck on the molded product 25. By this action, the peeling bars 22 are inserted between the lower release film 12 and the molded product 25, so that the lower release film 12 lifted and inflected can be compulsorily removed from the molded product 25 (see FIG. 9B). Note that, number of the peeling bars 22 is not limited to two. For example, one peeling bar may be employed.

The peeling bars 22 are not limited to the example shown in FIG. 3. Other peeling means may be employed as far as the lower release film 12 can be removed by inserting the peeling means between the lower release film 12 and the molded product 25. For example, the lower release film 12 may be removed by moving the peeling bar 22, which is located on at least the right or left side of the die and extended in the feeding direction of the lower release film 12, in said direction. In this case, preferably a front end part of the peeling bar 22 has enough width so as not to penetrate the lower release film 12.

Next, the hole-forming jig 23 will be explained.

Figure 4A:
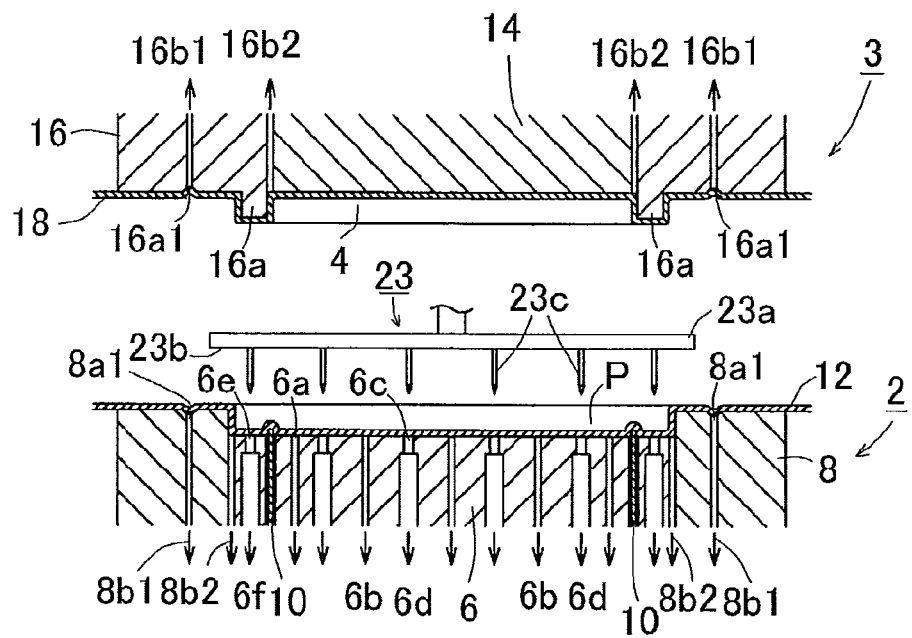
FIGS. 4A and 4B are sectional views of the molding die set, which show resin molding steps.

The hole-forming jig 23 can be correctly positioned with respect to the lower block 6 provided in a part of the conveying section 200. As shown in FIG. 4A, the hole-forming jig 23 includes a main body section 23a and a plurality of needles 23c, which are provided on a film-facing surface 23b of the main body section 23a and projected therefrom. Layout of the needles 23c in the main body section 23a corresponds to that of the work drawing holes 6c formed in the lower block 6. For example, a separation between the adjacent needles 23c is equal to that between the adjacent work drawing holes 6c formed in the lower block 6.

Figure 4B:
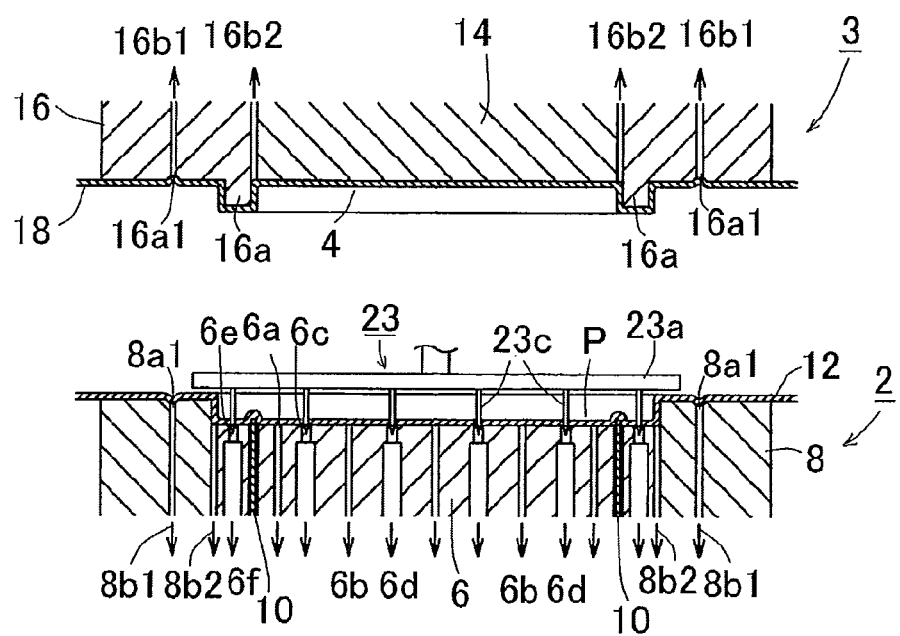

In FIG. 4A, the hole-forming jig 23 entering the molding die set 1 is correctly positioned by engaging the lower lock block 19 (see FIG. 3) with a positioning member of the conveying section 200, so that the work drawing holes 6c and the pressure reduction holes 6e are positioned immediately under the needles 23c. Note that, in the drawings, arrows indicate air suction (pressure reduction) through the holes, and explanation will be omitted in some examples. As shown in FIG. 4B, the work sucking holes 12g are formed, by inserting the needles 23c of the hole-forming jig 23 into the work drawing holes 6c and the pressure reduction holes 6e, in the lower release film 12, which has been sucked and held on the lower clamping face by sucking air through the film sucking holes 6a, 8a1 and 8a2, the work drawing holes 6c and the pressure reduction holes 6e. FIG. 5 shows the state where the work sucking holes 12g are formed.

In the present embodiment, the hole-forming jig 23, the loader 20 and the off-loader 21 are positioned in the conveying section 200 at a time, but they may be independently moved into and away from the molding die set 1. Further, the hole-forming jig 23 may be moved upward and downward in the lower block 6, and the positioning action may be omitted. In this case, the needles 23c of the hole-forming jig 23 are inserted into the work drawing holes 6c and the pressure reduction holes 6e so as to form the work sucking holes 12g and drawing holes 12h in the lower release film 12 sucked and held on the lower clamping face. In this case, an outer diameter of the needles 23c of the hole-forming jig 23 is sufficiently smaller than inner diameters of the work drawing holes 6c and the pressure reduction holes 6e. Therefore, the release film 12 can be securely held, so that the needles 23c can be pulled out without peeling the lower release film 12 from the lower block 6 after forming the holes, and enough sucking force can be obtained even if the needles 23c exist in the work drawing holes 6c and the pressure reduction holes 6e. In case that the release film 12 is sucked in the state where the needles 23c exist in the work drawing holes 6c and the pressure reduction holes 6e, side holes respectively communicating with the work drawing holes 6c and the pressure reduction holes 6e may be formed. Each of the side holes is opened on the upper side with respect to the front end of the needle 23c and air is sucked through the side holes, so that the lower release film 12 can be sucked without reducing the sucking force by the needles existing in the work drawing holes 6c and the pressure reduction holes 6e.

In case that the upper die 2 and the lower die 3 are inverted, the needles 23c of the hole-forming jig 23 may be extended upward so as to form the work sucking holes in the upper release film 18.

Figure 5A:
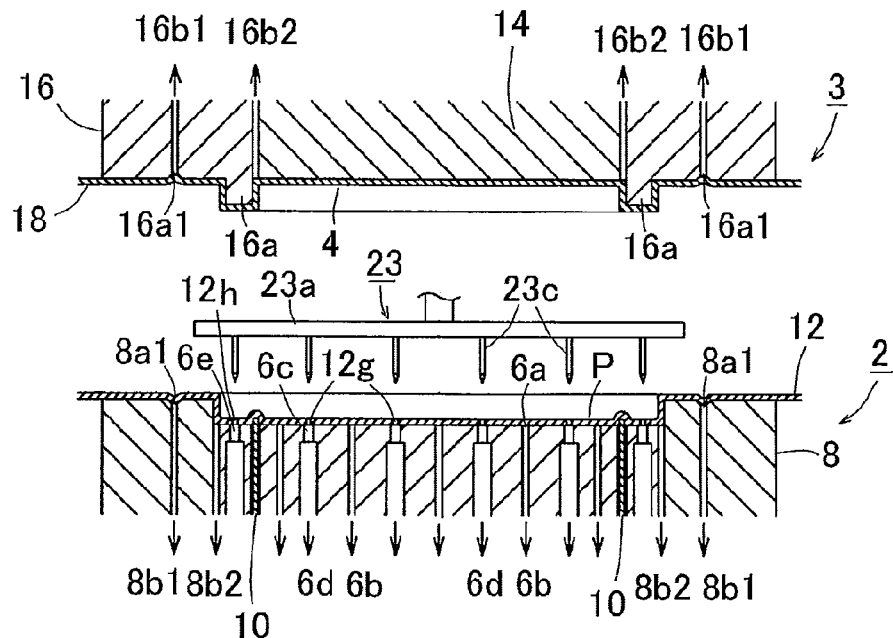
FIGS. 5A and 5B are sectional views of the molding die set, which show resin molding steps following the step shown in FIG. 4B.
Figure 5B:
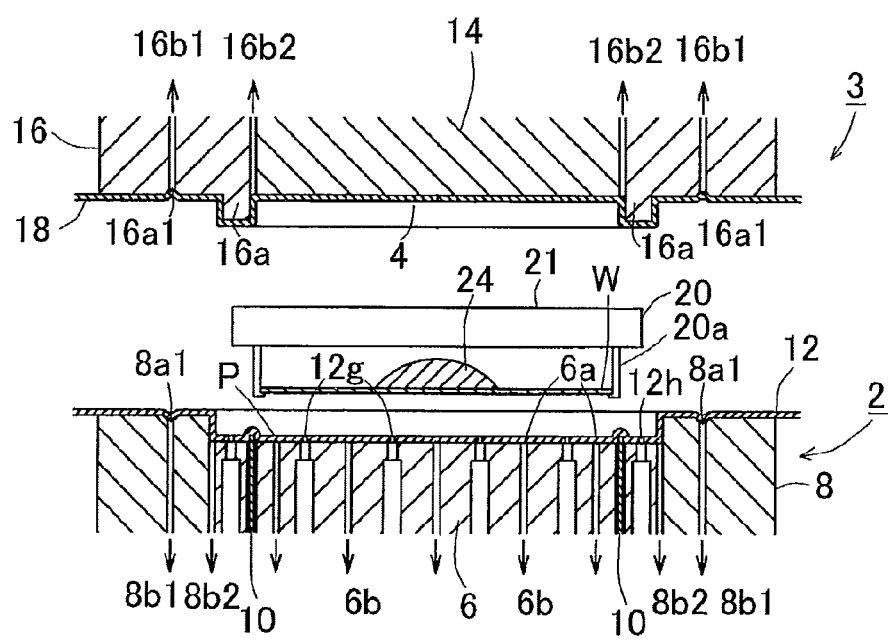

As shown in FIG. 5B, the loader 20 holds the outer periphery of the work W, on which the resin 24 (e.g., granular resin, liquid resin, resin sheet, resin tablet, gelled resin) has been supplied, by a chucking hand 20a and enters the molding die set 1. At that time, the loader 20 and the work mounting section of the lower die 2 are correctly positioned by the lower lock blocks 19 (see FIG. 3).

Figure 6A:
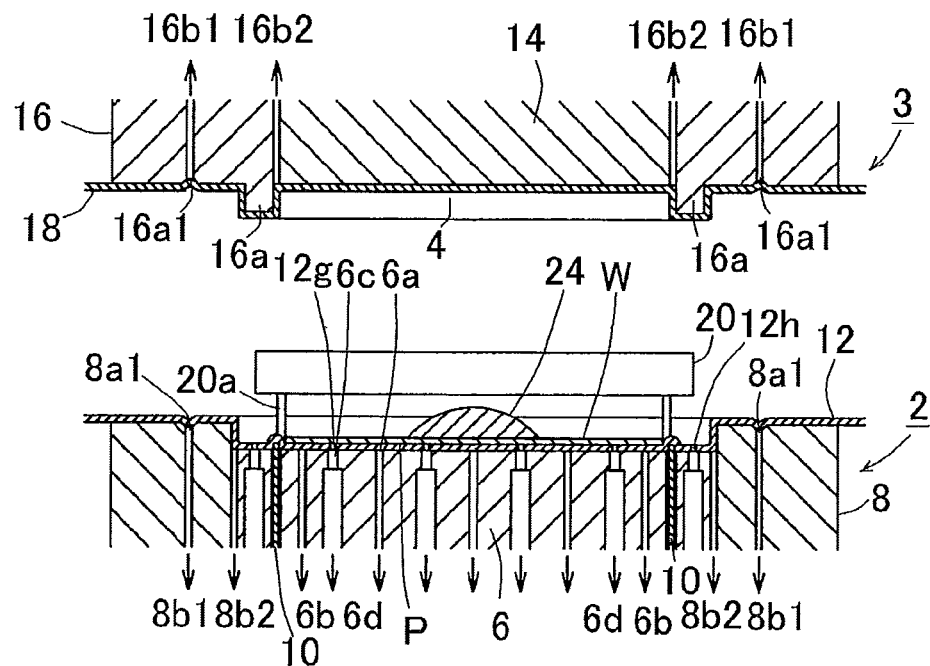
FIGS. 6A and 6B are sectional views of the molding die set, which show resin molding steps following the step shown in FIG. 5B.
Figure 6B:
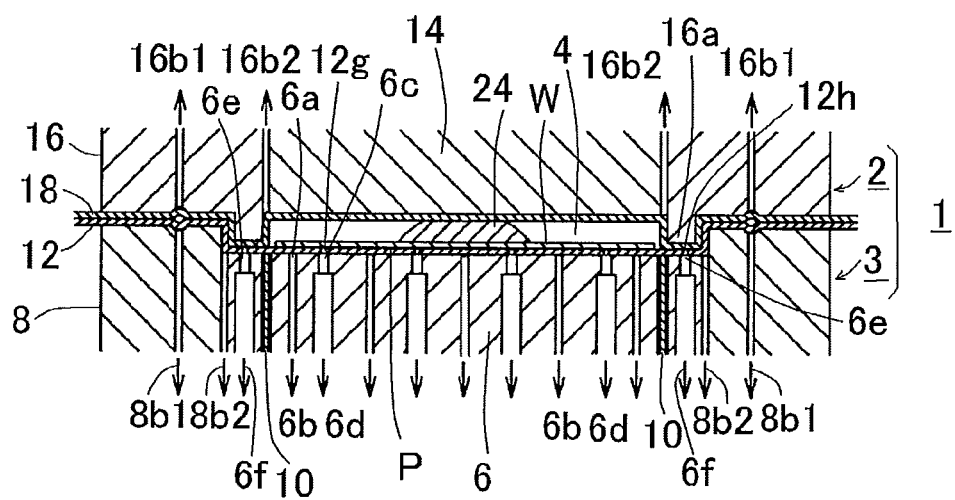

As shown in FIG. 6A, the loader 20 is moved downward so as to transfer the work W to the guide member 10, which is covered with the lower release film 12 and projected from the upper face of the lower block 6. The periphery of the work W is guided by the guide member 10, so that the work W can be correctly positioned on the lower block 6. The work W can be sucked and held on the lower block 6 (the work mounting face P) by sucking air through the work sucking holes 12g formed in the lower release film 12, the work drawing holes 6c and the work drawing paths 6d communicated with the work drawing holes 6c.

Note that, the loader 20 may have a sucking pad for sucking and holding the work W. In the present embodiment, the work W is conveyed into the molding die set 1 after supplying the resin 24 onto the work W, but the work W and the resin 24 may be separately supplied.

Figure 10:
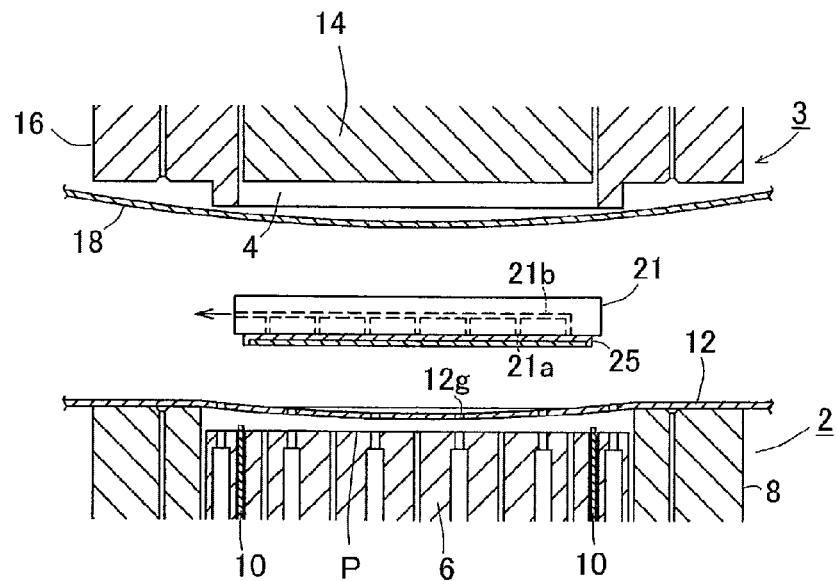
FIG. 10 is a sectional view of the molding die set, which shows a resin molding step following the step shown in FIG. 9B.

As shown in FIG. 10, the off-loader 21 sucks and takes out the molded product 25 from the opened molding die set 1 after completing the molding operation. The off-loader 21 is correctly positioned, with respect to the work mounting section of the lower die 2, by the lower lock blocks 19. In the off-loader 21, a plurality of sucking holes 21a are opened in a surface facing the molded product 25, and a sucking path 21b is communicated with the sucking holes 21a.

Figure 9A:
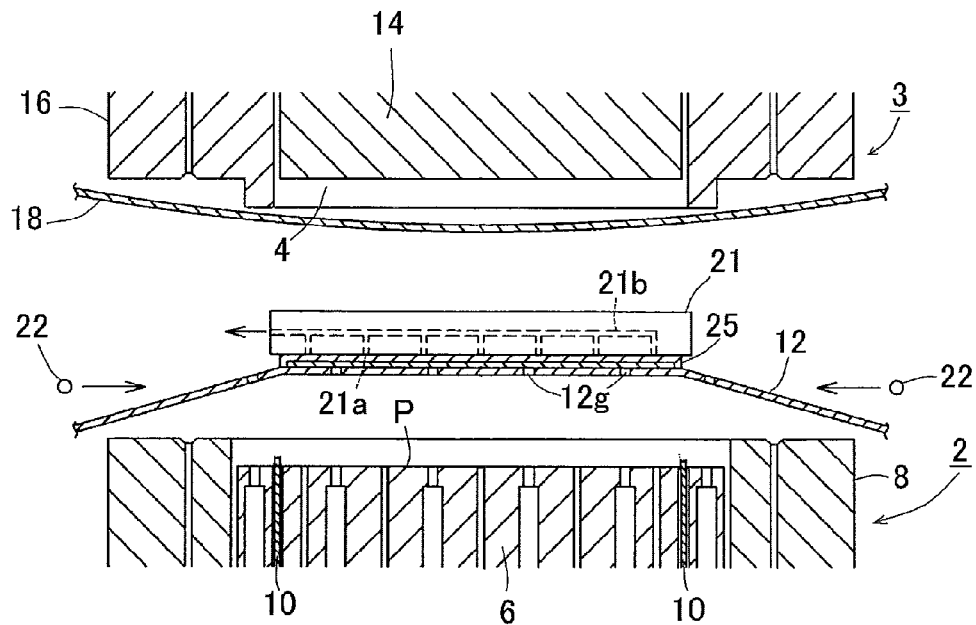
FIGS. 9A and 9B are sectional views of the molding die set, which show resin molding steps following the step shown in FIG. 8B.
Figure 9B:
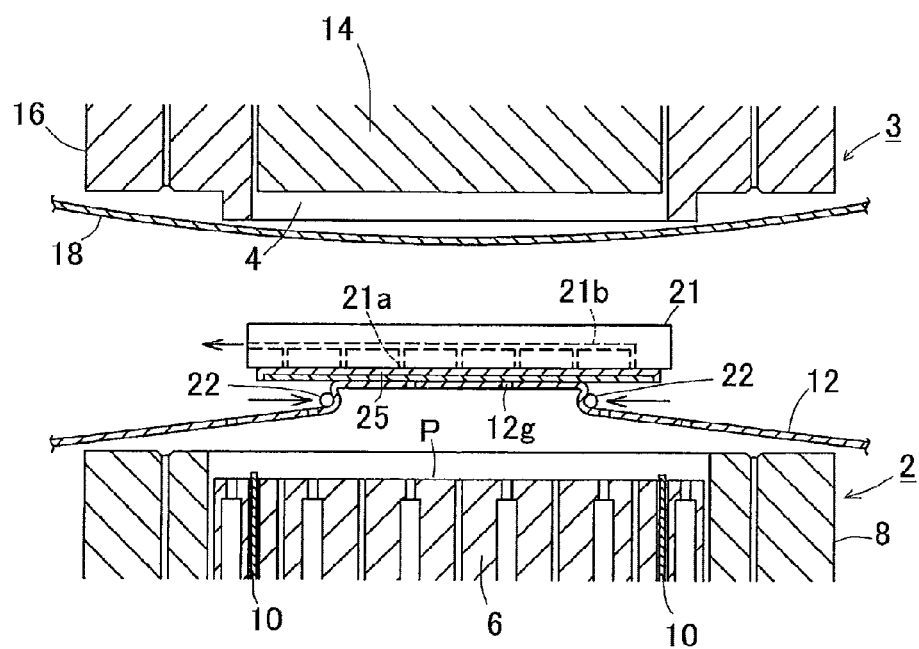

As shown in FIG. 9A, by lifting the off-loader 21 holding the molded product 25 upward, tension is applied to the lower release film 12 sticking on the molded product 25. In this state, the peeling bars 22, which can be moved parallel to the work W, are moved close to each other, as shown in FIG. 9B, so as to peel the lower release film 22 from the molded product 25.

Note that, the upper release film 18 sticking on an upper face of the molded product 25 is peeled from the molded product 25 by, for example, rotating the feed roll 12a and the collecting roll 18a (see FIG. 1) in the winding directions (opposite directions) and applying tension. If it is difficult to remove the upper release film 18 by this action, the peeling bars 22 may be provided to the upper die 3 as well as the lower die 2.

Next, an example of the method of the present invention will be explained with reference to FIGS. 1-10.

As shown in FIG. 1, the lower release film 12 covers the lower clamping face of the opened molding die set 1. As shown in FIG. 4A, the lower release film 12 is sucked and held, and the upper release film 18, which covers the upper clamping face including the cavity concave section 4, is also sucked and held. The lower release film 12, which covers the work mounting face P, is held by sucking through the film sucking holes 6a of the lower block 6 and the film sucking holes 8a1 and 8a2 of the lower clamper 8. The upper release film 18, which covers the cavity concave section 4, is held by sucking through the film sucking holes 16a1 and 16a2 of the upper clamper 16.

After the lower release film 12, which covers the lower clamping face, is sucked and held, the work sucking holes 12g and the drawing holes 12h are bored in the lower release film 12, by the hole-forming jig 23, as shown in FIGS. 4A-5A. Namely, as shown in FIG. 4A, firstly the hole-forming jig 23 is correctly positioned with respect to the lower block 6, and then the hole-forming jig 23 is moved downward, as shown in FIG. 4B, so as to respectively insert the needles 23 into the work drawing holes 6c and the pressure reduction holes 6e. With this action, as shown in FIG. 5A, the work sucking holes 12g and the drawing holes 12h are bored in the lower release film 12 which has been supplied to the molding die set 1. In this case, edges of the work sucking holes 12g of the lower release film 12 are sucked toward the work drawing holes 6c and drawn along inner circumferential faces of the work drawing holes 6c. Therefore, the work drawing holes 6c are not closed, so that the works W can be securely sucked through the work drawing holes 6c and securely held.

Next, as shown in FIG. 5B, the work W, on which the resin 24 has been supplied, is transferred onto the work mounting face P of the lower block 6 in a state where the outer periphery of the work W is chucked by the chucking hand 20a of the loader 20. As shown in FIG. 6A, the loader 20 is correctly positioned, in the molding die set 1, by the lock blocks 19 of the lower block 6, and then the work W, whose periphery is being guided by the guide member 10, is transferred. The work W is sucked, through the work sucking holes 12g formed in the lower release film 12 and the work drawing holes 6c communicated with the work sucking holes 12g, and held. At that time, the guide member 10 is biased by the springs 11 and projected from the work mounting face P. Further, air in the molding die set 1 is sucked through the drawing holes 12h, which are formed in the lower release film 12 with the work sucking holes 12g, the pressure reduction holes 6e, which are communicated with the drawing holes 12h, and the pressure reduction path 6f communicated with the pressure reduction holes 6e.

Next, the molding die set 1 is closed to clamp the work W together with the resin 24, and then the work W and the resin 24 are pressurized and heated in the cavity concave section 4. By uniformly driving each of the ball bearing screws 106 the prescribed amount, the lower die 2 is moved upward, with maintaining the lower die 2 parallel to the upper die 3, so as to bring the lower clamper 8 into contact with the upper clamper 16 and bring the outer periphery of the lower block 6 into contact with the projecting section 16a. At that time, the guide member 10 is retracted into the lower block 6 against elasticity of the springs 11. By employing the movable guide member 10, a shape of a resin-molded part is not limited by a work positioning mechanism.

By closing the cavity concave section 4, a decompressed space can be formed therein. To form the decompressed space, air in the cavity concave section 4 is discharged through an air vent, which is formed between the upper release film 18 and the lower release film 12, the pressure reduction holes 6e, which are communicated with the drawing holes 12h, and the pressure reduction path 6f, which is communicated with the drawing holes 12h.

Figure 7A:
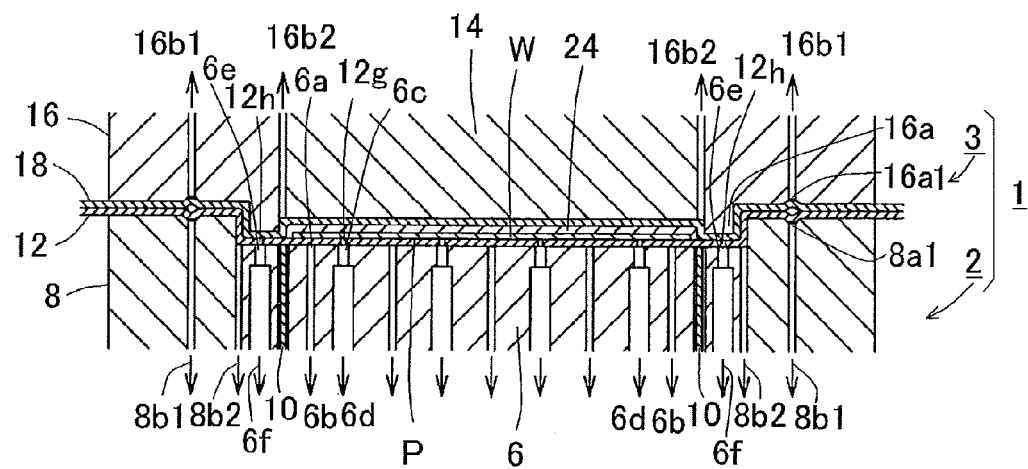
FIGS. 7A and 7B are sectional views of the molding die set, which show resin molding steps following the step shown in FIG. 6B.

In a state shown in FIG. 7A, the lower die 3 is further moved upward, and the cavity concave section 4 is filled with the resin 24. Forming the resin-molded part (package) having a designed thickness is completed. In this state, the resin 24 is heated and cured.

Figure 7B:
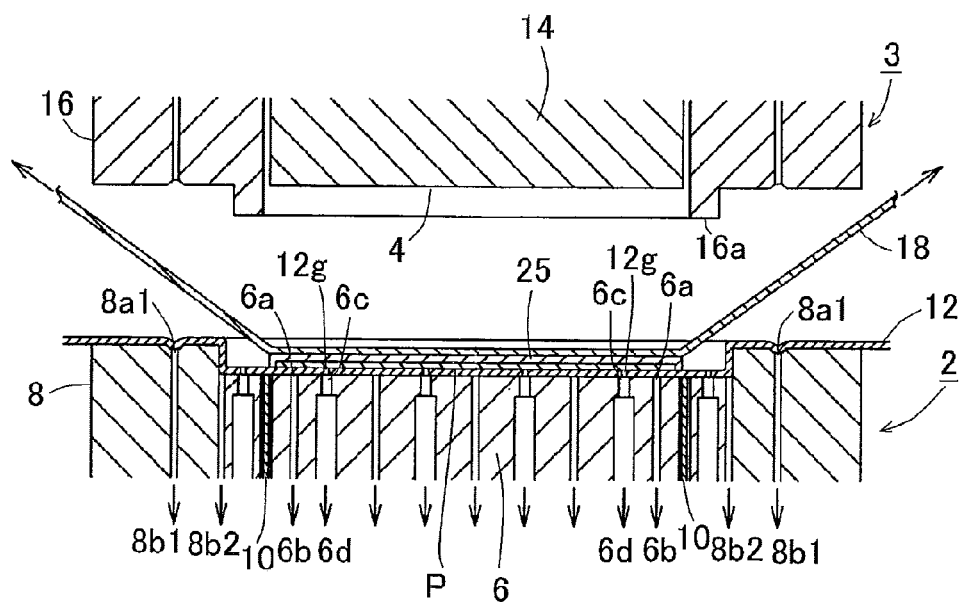
Figure 8A:
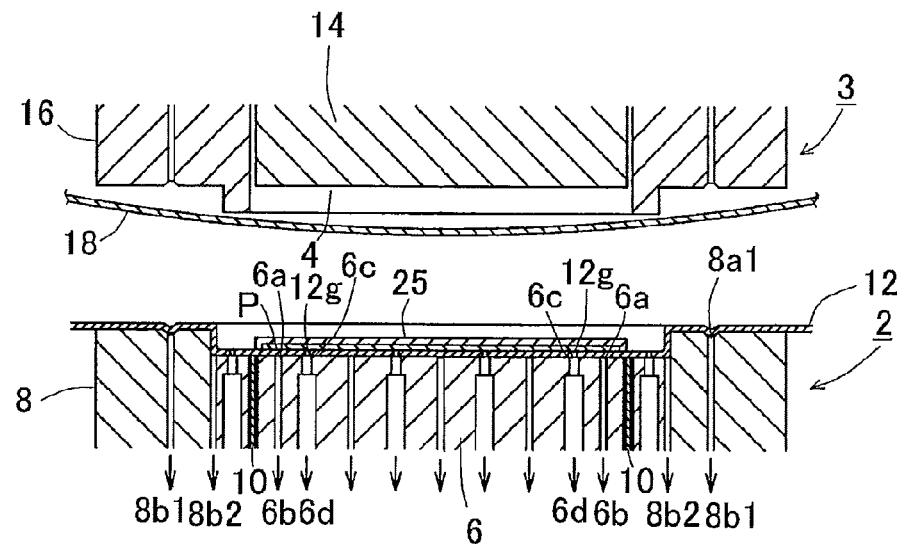
FIGS. 8A and 8B are sectional views of the molding die set, which show resin molding steps following the step shown in FIG. 7B.

Next, the upper release film 18, which are sucked through the film sucking holes 16a1 and 16a2 of the upper clamper 16 and held on the upper clamping face, is released from the suction, and then the molding die set 1 is opened. At that time, the suction through the drawing holes 12h and the pressure reduction holes 6e is stopped. Next, as shown in FIG. 7B, the lower die 2 is moved downward, so that the upper release film 18, which has been stuck on the upper clamping face, is peeled from the upper clamping face by moving the molded product 25, on which the upper release film 18 has been stuck by the cured resin 24, downward. Tension is applied to the upper release film 18, by rotating the feed roll 18a and the collecting roll 18b (see FIG. 1) for rewinding the upper release film 18, in a state where the molding die set 1 is opened and the work W is sucked and held on the work mounting face P of the lower die 3 (the lower release film 12). By applying the tension, the upper release film 18 can be peeled from the molded product 25 as shown in FIG. 8A.

Figure 8B:
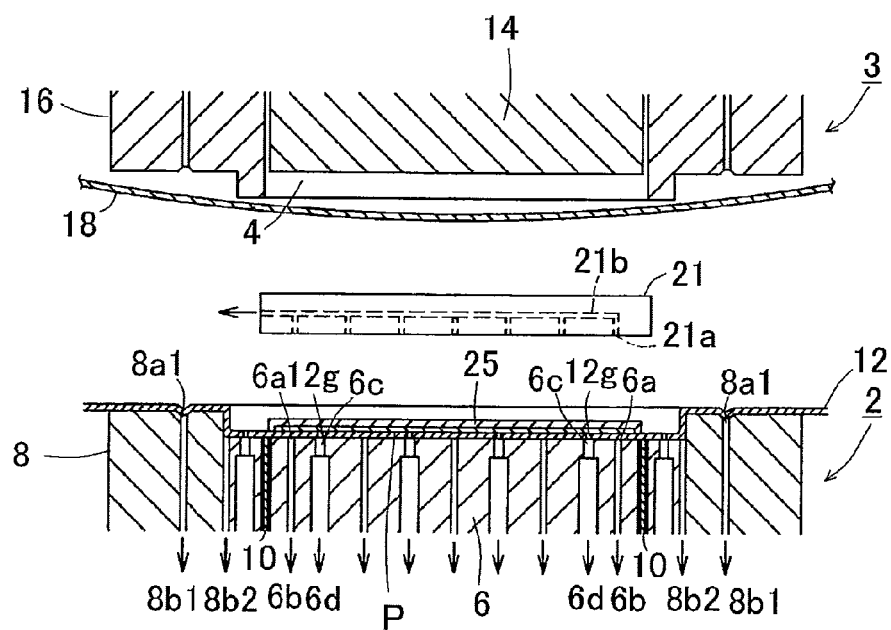

Next, as shown in FIG. 8B, the off-loader 21 enters the molding die set 1, which has been opened, so as to suck and take out the molded product 25. At that time, the suction through the film sucking holes 6a, 8a1 and 8a2 of the lower clamping face and the work sucking holes 12g has been previously stopped. As shown in FIG. 9A, the molded product 25 is sucked and lifted from the work mounting face P, by the off-loader 21, in the state where the release film covering the work mounting face P is stuck on the molded product 25. By moving the off-loader 21 upward with sucking the molded product 25 through the sucking holes 21a, the lower release film 12 sticking on the molded product 25 is lifted upward. The guide member 10 is projected again from the work mounting face P by the elasticity of the springs 11 (see FIG. 1).

As shown in FIG. 9B, the pair of peeling bars 22 are moved close to each other under the molded product 25, and the peeling bars 22 are inserted into spaces between the lower release film 12 and the molded product 25 so that the lower release film 12 can be peeled from the molded product 25.

As shown in FIG. 10, the molded product 25, from which the lower release film 12 has been removed, is sucked and held by the off-loader 21 and conveyed to the following process stage.

In the above described resin molding method and resin molding apparatus, the work W is sucked through the work sucking holes 12g of the lower release film 12, which covers the lower clamping face and which is sucked and held thereon, and held on the lower clamping face, and a gap between the lower side face of the work W and the lower clamping face is filled with the lower release film 12 without clamping the outer periphery of the work W, so that invasion of the resin 24 can be prevented. The work W can be resin-molded, in a state where the work W is positioned and held on the lower clamping face, without contaminating the lower side face of the work W and the lower clamping face with resin 24.

Even if the outer periphery of the work W of the molded product 25 is resin-molded, the peeling bars 22 are moved in the state where the molding die set 1 is opened and the tension is applied to the lower release film 12 sticking on the molded product 25, so that the lower release film 12 can be securely peeled and the peeling action can be performed stably.

Note that, in the molded product 25, the work W including the outer periphery are resin-molded, so the outer periphery of the work W and a marking section (e.g., linear section, notch) thereof, which is used in following steps (e.g., forming redistribution layers, forming bumps) performed after the resin molding step, are covered with the resin 24. Therefore, the position of the work W cannot be confirmed on the basis of the outer periphery thereof. Thus, for example, an energy wave (e.g., visible ray, infra-red ray) is radiated toward the outer periphery and the marking section relating to the exposed side of the work W so as to recognize the shape of the molded product 25. Then, the position (displacement) of the outer periphery of the work W with respect to the outer periphery of the molded product 25 is calculated and stored as a datum corresponding to the molded product 25, so that the position of the outer periphery of the work W can be calculated, from the outer shape of the molded product 25, by using of said datum and the molded product 25 can be correctly positioned in said following steps. In case that it is difficult to confirm the marking section, the resin 24 covering the outer periphery (including the marking section) of the work W may be sublimated, by laser means, so as to expose the outer periphery. Therefore, in the present embodiment, even if the outer periphery of the work W is not exposed, the molded product 25 can be correctly positioned in said following steps.

Figure 11:
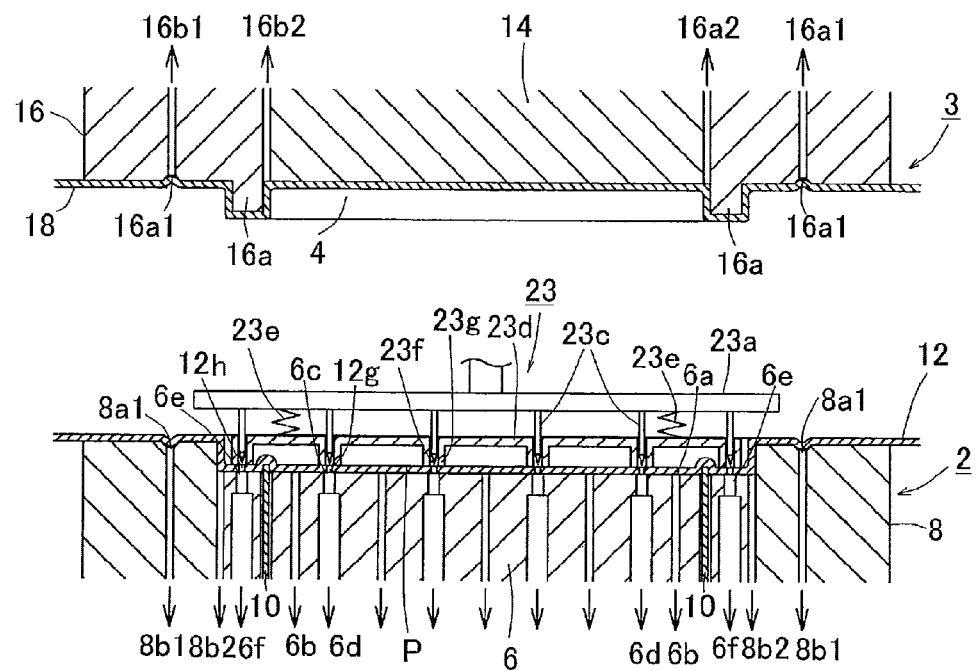
FIG. 11 is a sectional view of the molding die set including a hole-forming jig.

Next, another example of the hole-forming jig 23 will be explained with reference to FIG. 11.

The hole-forming jig 23 has a stripper. Concretely, the hole-forming jig 23 has a guide plate 23d, which is suspended from the main body section 23a by springs 23e. The guide plate 23d has through-holes 23f, through which the needles 23c can penetrate, and guide cylinders 23g, which are extended downward so as to guide the needles 23c.

The hole-forming jig 23 is correctly positioned with respect to the lower block 6, and then the main body section 23a is moved downward so as to press the lower release film 12 by the guide cylinders 23g of the guide plate 23d. The main body section 23a is further moved downward until the needles 23c of the hole-forming jig 23 respectively enter the work drawing holes 6c opened in the work mounting face P and the pressure reduction holes 6e. By this action, the work sucking holes 12g and the drawing holes 12h are formed in the lower release film 12 set in the molding die set 1. At that time, edges of the holes to be formed are pressed by the guide cylinders 23g, so that slack and break of the edges of the work sucking holes 12g and the drawing holes 12h can be prevented. Further, the holes can be formed without extending the lower release film 12 and peeling off the lower release film 12 from the lower clamping face, which are caused by drawing the lower release film 12 when the needles 23 are pulled out.

Next, another peeling means will be explained with reference to FIGS. 12A and 12B.

Figure 12A:
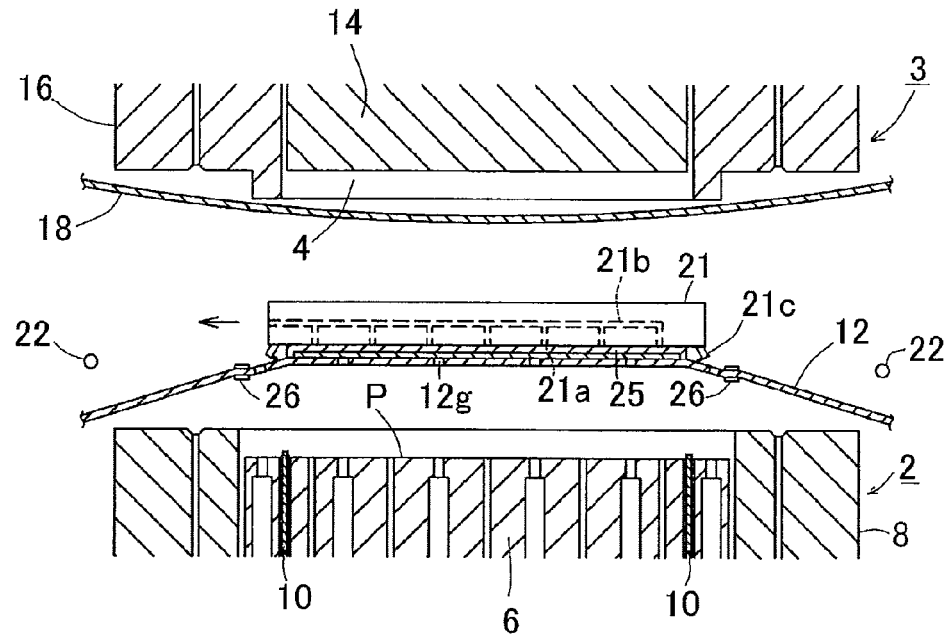
FIGS. 12A and 12B are sectional views of the molding die set including peeling means.

In FIG. 12A, the off-loader 21 sucks the work W through the sucking holes 21a and chucks the outer periphery of the work W by a chucking hand 21c so as to prevent the work W from falling down. The off-loader 21 has the peeling bars 22 and peeling chucks 26 acting as the peeling means. The peeling chucks 26 are moved upward and downward with chucking the upstream side of the lower release film 12 and the downstream side thereof. For example, a pair of hands, each of which clamps the lower release film 12 from the upper side and the lower side, are located outside of the molding die set 1 for standby; the pair of hands are moved to enter the molding die set 1 for clamping the lower release film 12. By providing a driving mechanism for moving the pair of hands upward and downward, the lower release film 12 can be clamped and moved upward as shown in FIG. 12A.

In FIG. 12A, the lower release film 12 covering the work mounting face P is lifted from the work mounting face P by the off-loader 21 holding the molded product 25. At that time, the peeling chucks 26, which have been moved to the both sides of the lower release film 12, chuck the lower release film 12.

Figure 12B:
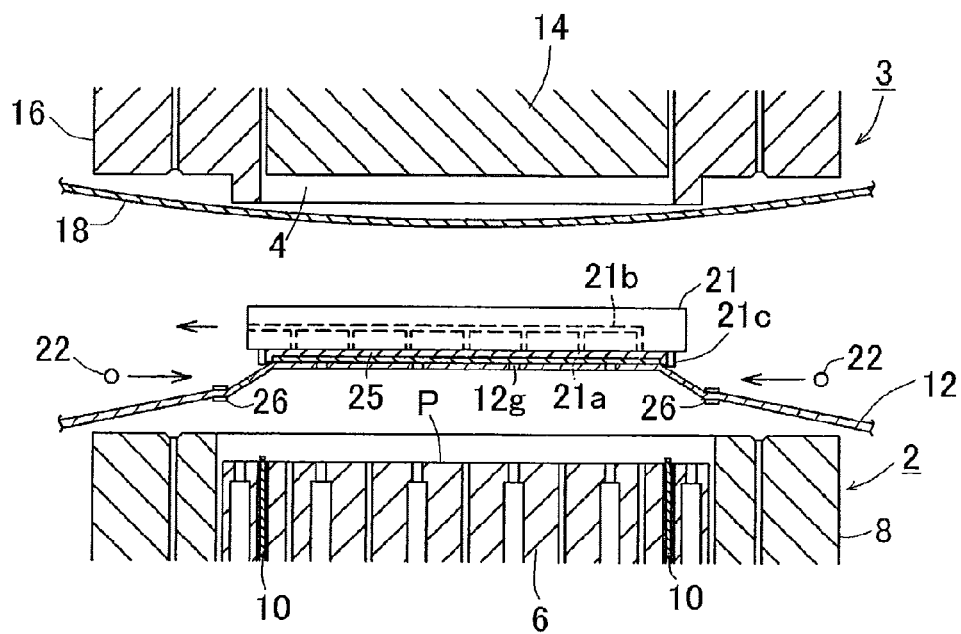

Next, as shown in FIG. 12B, the peeling chucks 26 are moved downward so as to apply tension to the lower release film 12. Therefore, the release film 12 is peeled from the outer periphery of the molded product 25, and the chucking hand 21c is inserted into spaces between the lower release film 12 and the molded product 25 so as to chuck the molded product 25.

In the state where tension is applied to the lower release film 12, the peeling bars 22 are moved under the molded product 25, so that the lower release film 25 can be securely removed from the molded product 25. Note that, if the lower release film 12 can be removed by only the peeling chucks 26 according to, for example, a type of the resin 24, the peeling bars 22 need not be used.

The off-loader 21 may have a sucking pad for sucking and holding the work W so as to lift the work W from the work mounting face P. In this case, preferably a product receiving table (not shown) is inserted under the lower release film 12 when the both sides of the lower release film 12, in the width direction, are chucked by the peeling chucks 26 and moved downward. The product receiving table prevents the molded product 25 from falling from the off-loader 21 when the lower release film 12 is peeled from the molded product 25.

Figure 13:
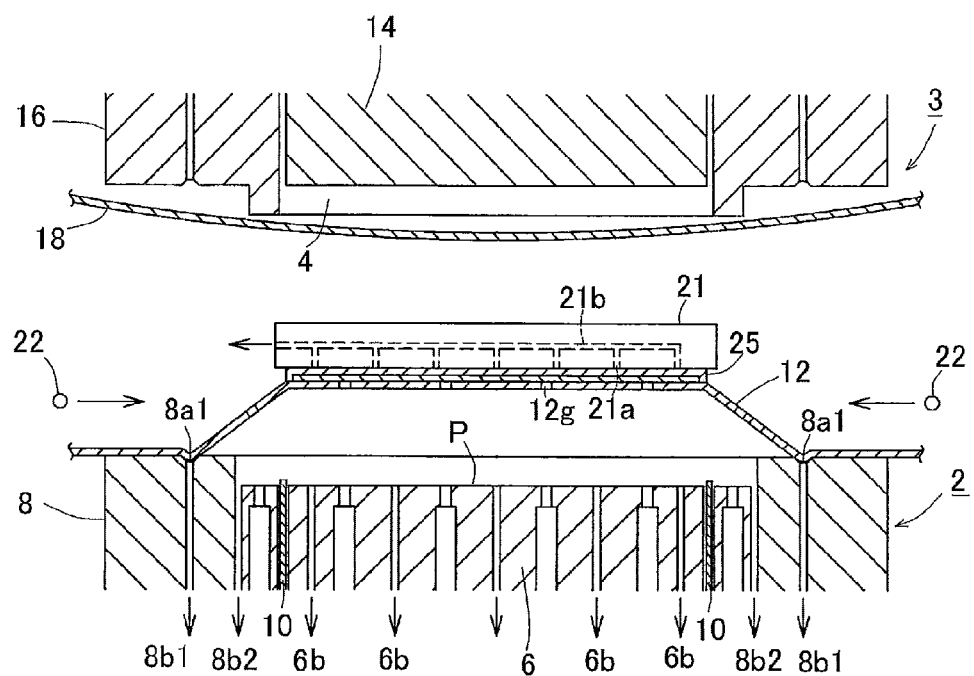
FIG. 13 is a sectional view of the molding die set including another peeling means.

A further example of the peeling means will be explained with reference to FIG. 13.

When the off-loader 21 sucks and holds the molded product 25, the suction through the work drawing holes 6c and the pressure reduction holes 6e in the lower clamping face is stopped. And then, the off-loader 21 may be moved upward with maintaining the suction of the lower release film 12 through the film sucking holes 6a, 8a1 and 8a2. In this case, the lower release film 12, which has been adhered on the molded product 25 with adhesive force greater than sucking force through the lower block 6, is lifted together with the molded product 25, and the lower release film 12 is sucked and drawn into the groove communicated with the film sucking holes 8a1 of the lower clamper 8. Therefore, tension is applied to the lower release film 12 sticking on the molded product 25. In this state, the peeling bars 22 are moved under the molded product 25 so as to peel the lower release film 12 from the molded product 25.

Figure 14A:
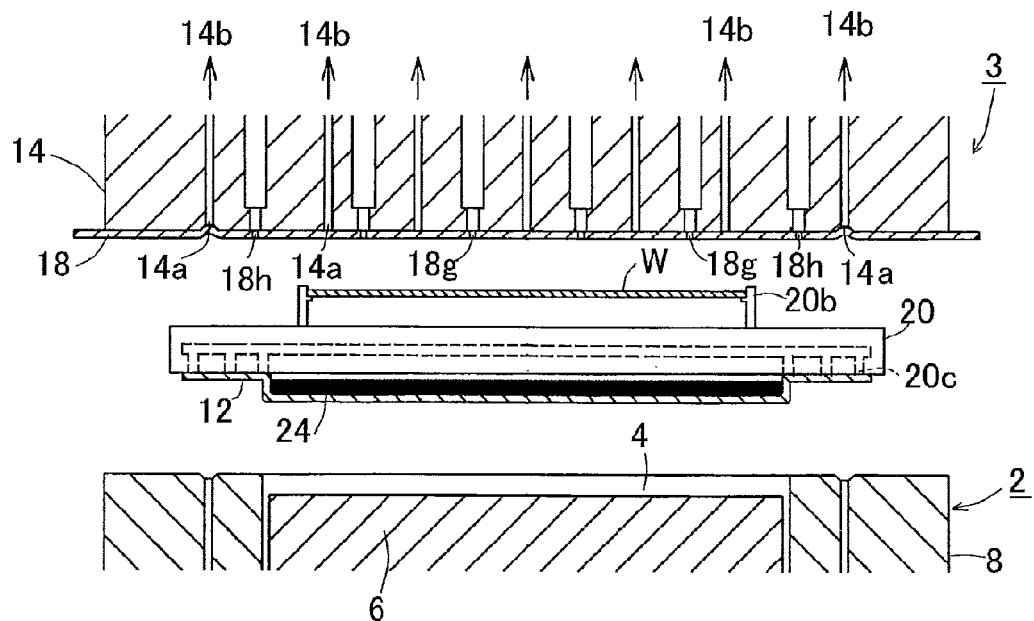
FIGS. 14A and 14B are sectional views of the molding die set and a loader of another embodiment, which show resin molding steps.
Figure 14B:
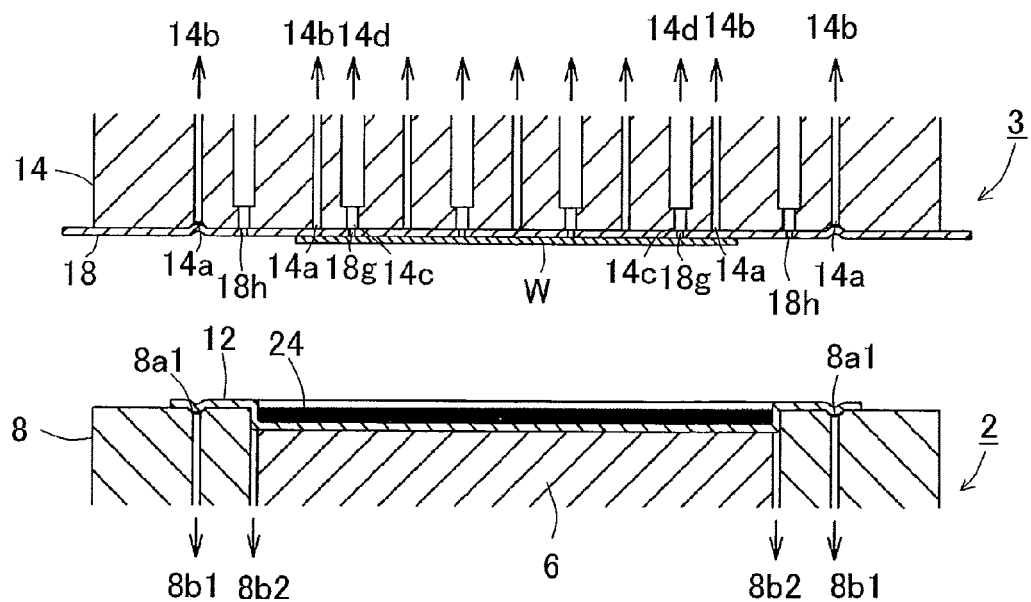
Figure 15:
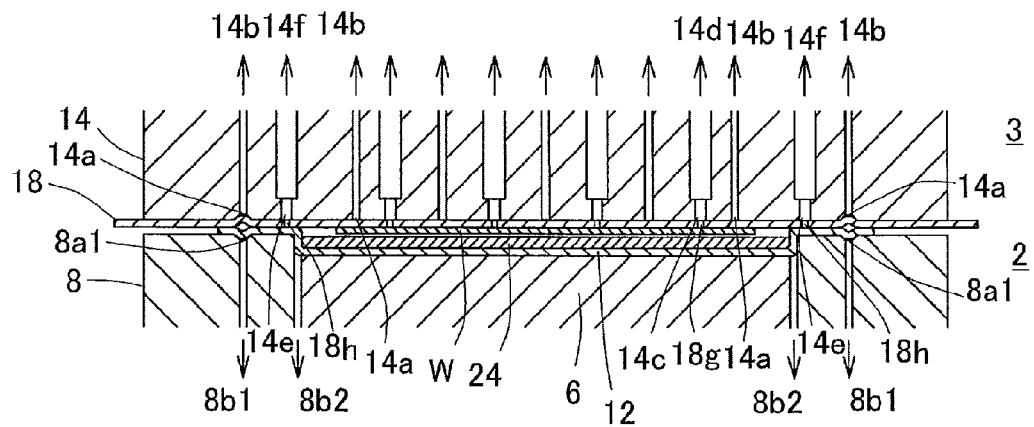
FIG. 15 is a sectional view of the molding die set, which shows a resin molding step following the step shown in FIG. 14B.

Next, another embodiment of the resin molding apparatus will be explained with reference to FIGS. 14A-17B. In the present embodiment, as shown in FIGS. 14A-15, the structure of the dies 2 and 3 is inverted with respect to that shown in FIG. 1. The upper release film 18 is an elongated film wound on the feed roller 18a and the collecting roller 18b, but the lower release film 12 is a rectangular film.

In FIG. 14A, the work W is sucked and held on the upper die 3 together with the upper release film 18 covering the upper block 14. The upper release film 18 is sucked through the film sucking holes 14a and sucking paths 14b opened in the upper clamping face of the upper block 14. Work sucking holes 18g and drawing holes 18h are formed in the upper release film 18 by inserting the needles 23c of the hole-forming jig 23 into work drawing holes 14c as well as the example shown in FIG. 4A. The work W is sucked through the work drawing holes 14c and work drawing paths 14d of the upper block 14 and the work sucking holes 18g of the upper release film 18, so that the work W can be held on the upper clamping face as shown in FIG. 14B. Further, as shown in FIG. 15, pressure reduction holes 14e are opened in the upper clamping face, and pressure reduction paths 14f are respectively communicated with the pressure reduction holes 14e.

The lower release film 12 is sucked in the cavity concave section 4, which is constituted by the lower block 6 and the lower clamper 8, through the film sucking holes 8a1, the film sucking paths 8b1 communicated with the film sucking holes 8a1, the film sucking holes 8a2 and the film sucking paths 8b2 communicated with the film sucking holes 8a2, and held in the cavity concave section 4. The resin 24 is supplied for resin-molding the work W with using the lower release film 12.

The loader 20 holds the work W by a work holder 20b facing the upper clamping face. The lower release film 12, on which the resin 24, e.g., granular resin, liquid resin, has been supplied, is sucked and held on a bottom face of the loader 20. In this state, the loader 20 enters the opened molding die set 1 (see FIG. 14A). The loader 20 is correctly positioned, with respect to the upper block 14 and the lower block 16, by, for example, the lock blocks 19 shown in FIG. 3.

Next, the work W is transferred onto the upper clamping face and sucked through the work sucking holes 18g so as to hold the work W thereon. The loader 20 transfers the lower release film 12, on which the resin 24 has been supplied, to the cavity concave section 4, and the lower release film 12 is sucked, through the film sucking holes 8a1 and 8a2, and held (see FIG. 14B).

Next, as shown in FIG. 15, the molding die set 1 is closed, and the lower die 2 is moved upward, until a thickness of the package reaches the designed thickness, so as to clamp the work W together with the resin 24. And then, the resin 24 is heated and cured. At that time, air in the cavity concave section 4 is discharged via the air vent formed between the upper release film 18 and the lower release film 12, the drawing holes 18h, the pressure reduction holes 14e communicated with the drawing holes 18h, and the pressure reduction paths 14f communicated with the pressure reduction hoes 14e. In this case, the upper release film 18 may be removed, in the molding die set 1, by applying tension by suction or using rollers as well as the former embodiment. Since the lower release film 12 is the rectangular film, the molded product 25 may be taken out from the molding die set 1 and the lower release film 12 may be removed after the upper release film 18 is removed by applying tension by the suction or using the rollers.

Note that, the loader 20 transfers the lower release film 12, on which the resin 24 has previously supplied, to the lower die 2. In some cases, the lower release film 12 may be previously sucked and held on the lower clamping face including the cavity concave section 4, and then the resin 24 may be supplied into the cavity concave section 4 covered with the lower release film 12.

Next, a further embodiment of the resin molding apparatus will be explained with reference to FIGS. 16A and 16B.

In the present embodiment, the structure of the molding die set 1 is similar to that shown in FIGS. 14A and 14B, but both of the upper release film 18 and the lower release film 12 are rectangular films. The work sucking holes 18g and the drawing holes 18h have been previously formed in the upper release film 18.

Figure 16A:
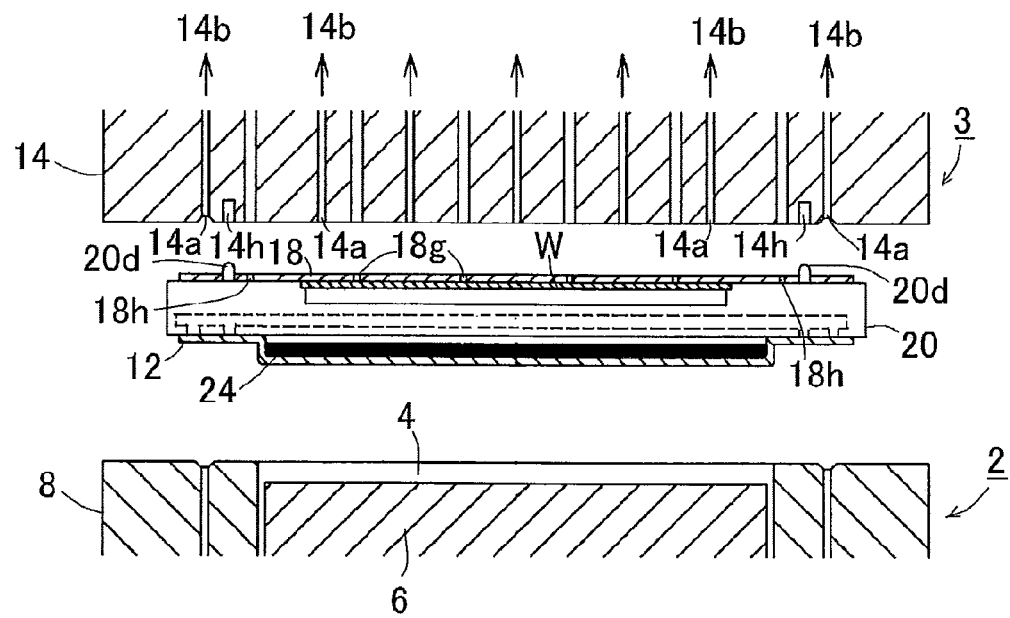
FIGS. 16A and 16B are sectional views of the molding die set and the loader of a further embodiment.

In FIG. 16A, the loader 20 is correctly positioned, with respect to the upper block 14, by inserting positioning pins 20d, which are projected from the loader 20, into positioning holes 14h formed in the upper clamping face of the upper block 14. With this structure, as shown in FIG. 16B, the work sucking holes 18g, the work drawing holes 14c and the work drawing paths 14d can be communicated with each other, and the drawing holes 18h, the pressure reduction holes 14e and the pressure reduction paths 14f can be communicated with each other.

In the loader 20, the work W is mounted on the upper face facing the upper clamping face, the upper release film 18 is provided on the work W and correctly positioned by inserting the positioning pins 20*d* into positioning holes of the upper release film 18. Further, the lower release film 12, on which the resin 24, e.g., granular resin, liquid resin, sheet resin, has been supplied, is sucked through sucking holes 20*c* and held on the bottom face of the loader 20. The loader 20 conveys the work W, etc. to the opened molding die set 1 (see FIG. 16A). Note that, the resin 24 may be supplied into the cavity concave section 4, which has covered with the lower release film 12, with a plate-shaped reinforcing member so as to maintain the shape of the resin 24. The reinforcing member, whose planar size is smaller than that of the lower block 6, is supplied onto the lower release film 12. In this case, the molded product 25, which faces the surface of the reinforcing member, can be exposed by removing the reinforcing member after the resin molding is performed. Further, the reinforcing member can be used as heat sink by being remained on the face of the molded product 25. Note that, the loader 20 may include a shutter mechanism having an open/close shutter, which is provided immediately below the release film 12. While the resin 24 is conveyed into the molding die set 1, the shutter mechanism closes the shutter, so that the shape of the resin 24 can be maintained by supporting the shutter. On the other hand, when the resin 24 is in the molding die set 1, the shutter mechanism opens the shutter, so that the resin 24 can be supplied into the cavity concave section 4.

The loader 20 is correctly positioned, with respect to the upper block 14, by inserting the positioning pins 20*d* into the positioning holes 14*h*. At that time, the work W is transferred onto the upper clamping face and sucked through the work sucking holes 18*g* and the work drawing holes 14*c*, so that the work W can be securely held on the upper clamping face.

Figure 16B:
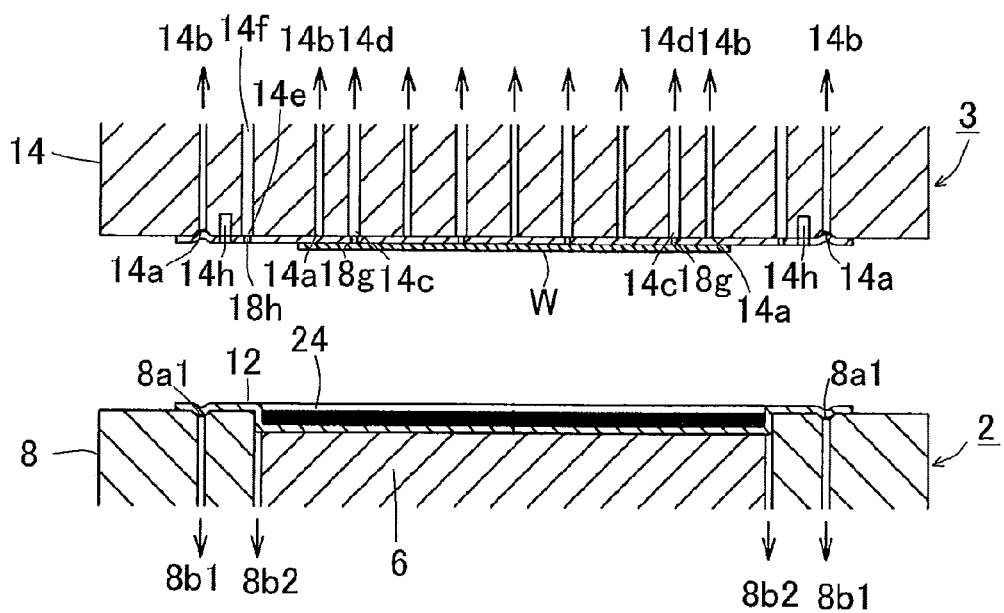

Further, the lower release film 12, on which the resin 24 has been supplied, is transferred into the cavity concave section 4, and the lower release film 12 is sucked through the film sucking holes 8*a*1 and 8*a*2 so as to hold the lower release film 12 in the cavity concave section 4 (see FIG. 16B).

Next, the molding die set 1 is closed, and the lower die 2 is moved upward, until a thickness of the package reaches the designed thickness, so as to clamp the work W together with the resin 24. And then, the resin 24 is heated and cured as well as the step shown in FIG. 15. In this case, the release films 12 and 18 may be removed in the molding die set 1, as well as the former embodiments. Further, both of the release films 12 and 18 are rectangular films, so the molded product 25 may be taken out from the molding die set 1 without removing the release films 12 and 18. In this case, the release films 12 and 18 are removed outside of the molding die set 1.

Note that, the upper release film 18 and the work W may be separately conveyed into the molding die set 1. Further, the lower release film 12 may be previously sucked and held on the lower clamping face including the cavity concave section 4, and then the resin 24 may be supplied into the cavity concave section 4 covered with the lower release film 12.

Successively, a further embodiment of the resin molding apparatus will be explained with reference to FIGS. 17A and 17B.

In the former embodiment shown in FIGS. 16A and 16B, the upper release film 18 is the rectangular film. If the work sucking holes 18*g* of the upper release film 18 and the work drawing holes 14*c* of the upper block 14 are misaligned and the drawing holes 18*h* and the pressure reduction holes 14*e* are also misaligned, there is a possibility that the work W cannot be sucked and held on the upper clamping face and the decompressed space cannot be formed.

Figure 17A:
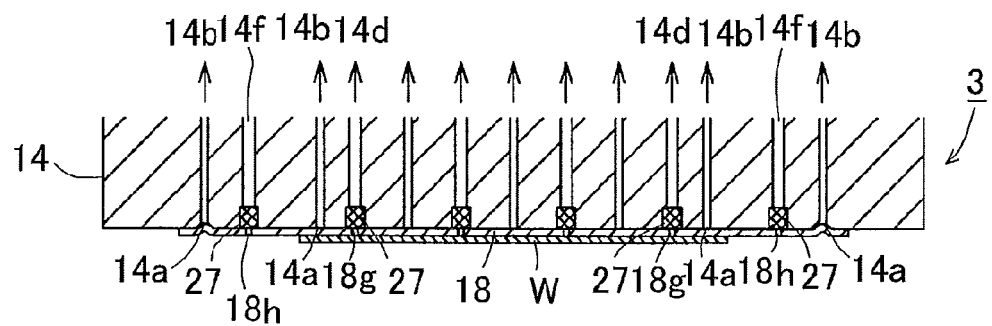
FIGS. 17A and 17B are sectional views of an upper die of the molding die set of a modified embodiment relating to the embodiment shown in FIGS. 16A and 16B.

Thus, as shown in FIG. 17A, porous members 27 which are respectively communicated with the work drawing paths 14*d* may be provided instead of the work drawing holes 14*c*, and porous members 27 which are respectively communicated with the pressure reduction paths 14*f* may be provided instead of the pressure reduction holes 14*e*. With this structure, the work sucking holes 18*g*, the drawing holes 18*h* and the porous members 27 need not be precisely positioned, so that the work sucking holes 18*g* and the drawing holes 18*h* can be easily communicated with the work drawing paths 14*d* and the pressure reduction paths 14*f* and the work W can be securely held. Further, air in the closed molding die set 1 can be securely discharged through the porous members 27, so that the decompressed space can be produced.

Figure 17B:
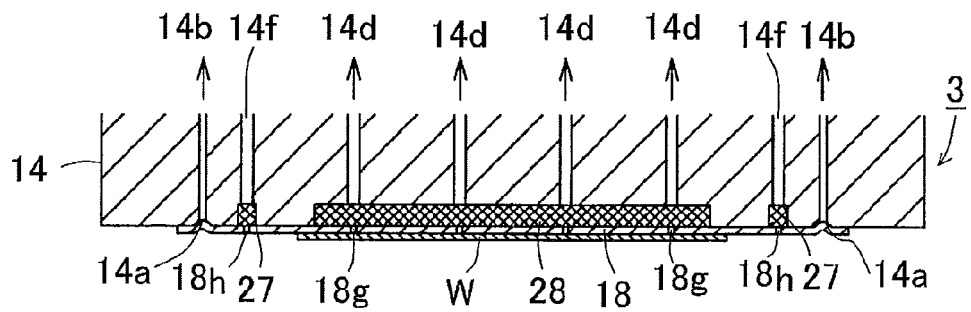

As shown in FIG. 17B, a porous member 28, whose planar size is smaller than that of the work W, may be provided in a work holding area of the upper clamping face of the upper block 14. In this case, the one porous member 28 can correspond to the work drawing paths 14*d*, so layout of the work drawing paths 14*d*, which will be communicated with the porous member 28, is not limited. Therefore, the work sucking holes 18*g* of the upper release film 18 need not be precisely positioned with respect to the work drawing paths 14*d*, so that the upper release film 18 can be easily held on the upper clamping face of the upper block 14.

In each of the above described embodiments, the upper release film 18 and the lower release film 12 are respectively sucked and held on the clamping faces of the dies 2 and 3. For example, in the present invention, only the lower release film 12 may be sucked and held on the lower clamping face, on which the work W including the resin 24 has been supplied, and the lower die 2 including the cavity concave section 4, which accommodates the work W, may be made of a suitable material (e.g., ceramic) which is easily separated from the upper clamping face capable of closing the cavity concave section with the lower clamper 8. In this case, the upper release film 18 may be omitted.

In each of the above described embodiments, the upper die 3 is a fixed die, and the lower die 2 is a movable die, but the fixed die and the movable die may be optionally selected. Further, in each of the above described embodiments, the work W is a silicon wafer which will be resin-molded at a time, but the work W may be a plastic substrate on which many semiconductor devices will be formed, a lead frame, etc.

Other examples of the works W to be resin-molded are shown in FIGS. 18A-18G, in which dotted lines show resin-molded parts formed on the works W.

Figure 18A:
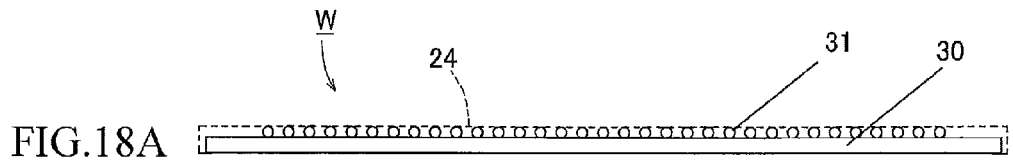
FIGS. 18A-18G are explanation views of works to be molded.
Figure 18B:
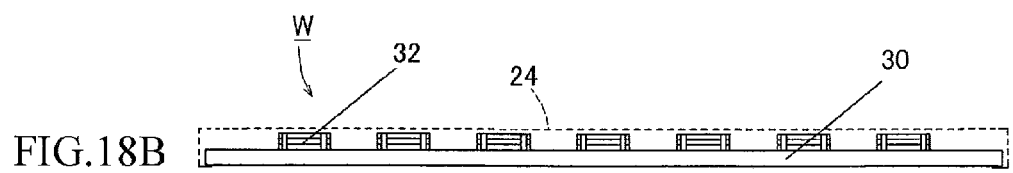
Figure 18C:
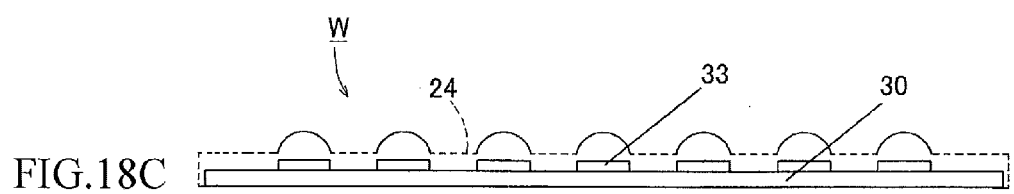
Figure 18D:
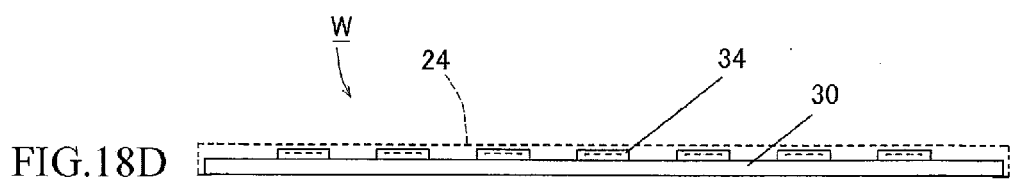
Figure 18E:
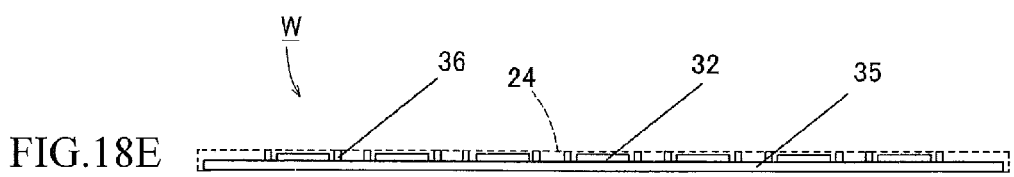
Figure 18F:
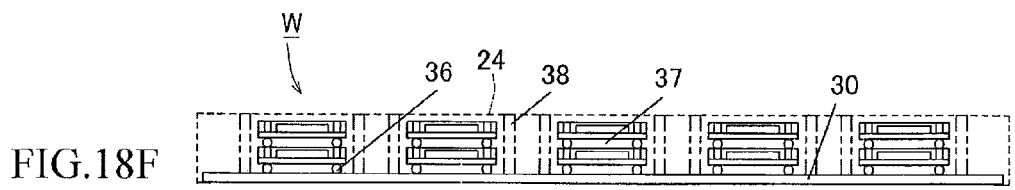
Figure 18G:
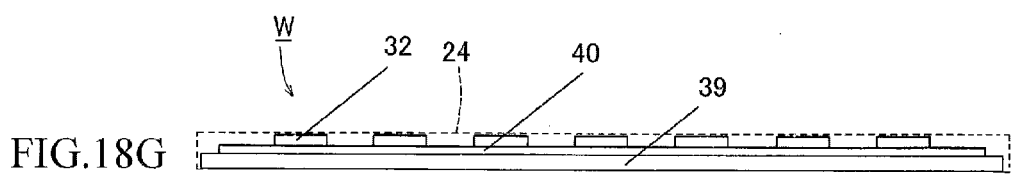

FIG. 18A shows the work W in which a plurality of bumps 31 are formed on a wafer 30. FIG. 18B shows the work W in which a plurality of semiconductor chips 32 or laminated chips having TSVs (Through Silicon Vias) are mounted on the wafer (substrate) 30. In this case, the work W may be a carrier on which chips having TSVs are fixed. FIG. 18C shows the work W, in which a plurality of optical semiconductor elements 33, e.g., light emitting elements, light receiving elements, are mounted on the wafer (substrate) 30. FIG. 18D shows the work W, in which a plurality of MEMS (Micro Electro Mechanical System) chips 34 are mounted on the wafer 30. FIG. 18E shows the work W, in which a plurality of the semiconductor chips 32 and terminals 36, e.g., bumps, vias, are mounted on an interposer substrate 35. FIG. 18F shows the work W, in which a plurality of laminated chips 37, in each of which a plurality of chips are laminated, are mounted on and a plurality of vias 38 are formed on the substrate 30. FIG. 18G shows the work W for eWLP molding, in which a plurality of the semiconductor chips 32 are fixed on a carrier 39 composed of, for example, stainless steel, glass, wafer, with a release sheet 40, e.g., thermal release sheet. In each of the above described embodiments, the resin 24 may be supplied, onto each of the shown works W, to form the resin-molded parts shown by the dotted lines.

In the present invention, it is only necessary to hold the work W on at least one of the clamping faces of the molding die set 1. For example, as shown in FIGS. 19A and 19B, the work W may be sucked and held on not only the clamping face of the lower die 2 but that of the upper die 3.

Figure 19A:
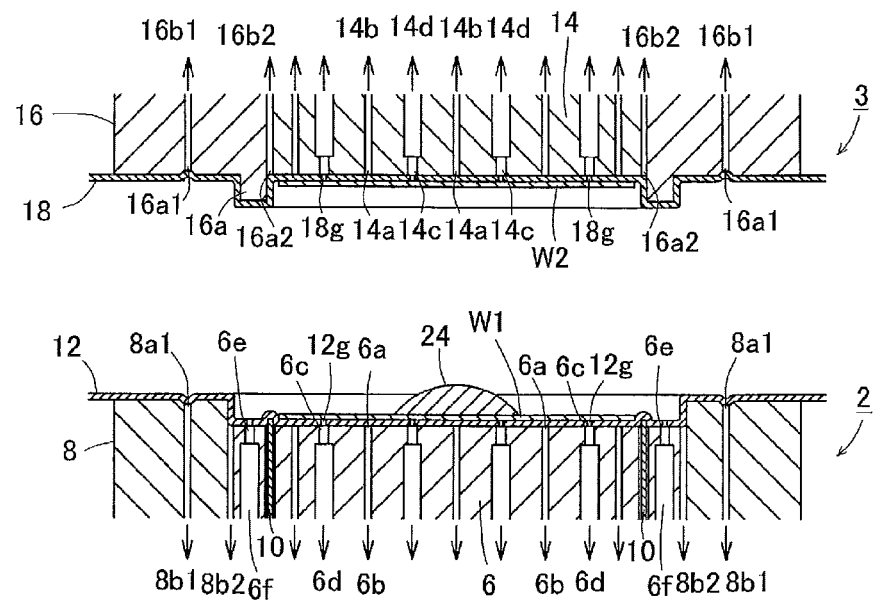
FIGS. 19A and 19B are sectional views showing opening and closed states of the molding die set of a further embodiment.
Figure 19B:
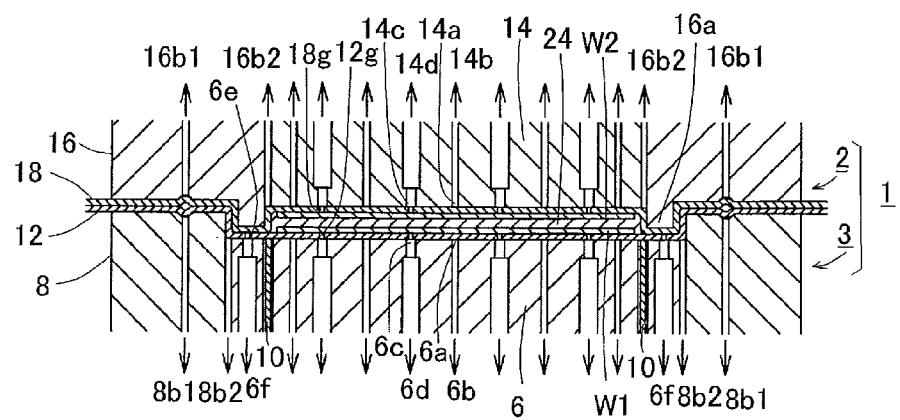

In FIG. 19A, the upper block 14 includes the film sucking holes 14*a*, which are opened in the bottom face, and the film drawing paths 14*b*, which are respectively communicated with the film sucking holes, as well as the lower block 6 shown in FIG. 1. Further, the work drawing holes 14*c* and the work drawing paths 14*d* communicated therewith, which are separated from the film sucking holes 14*a* and the film drawing paths 14*b*, are formed in the bottom face of the upper block 14. An inner diameter of the work drawing holes 14*c* is smaller than that of the work drawing paths 14*d*. The film drawing paths 14*b* and the work drawing paths 14*d* are formed in the upper block 14 and the upper base 13 (see FIG. 1) and communicated with a sucking unit (a pressure reduction unit) not shown.

In FIG. 19A, the upper release film 18, which covers a work sucking face of the upper die 3, is sucked through the film sucking holes 14*a* of the upper block 14 and the film sucking holes 16*a*1 and 16*a*2 of the upper clamper 15, so that the upper release film 18 can be held on the work sucking face. Note that, the work sucking holes 18*g* are formed in the upper release film 18 by the needles 23*c* of the hole-forming jig 23 shown in FIGS. 4A and 4B after the upper release film 18 is held on the upper clamping face. The work sucking holes 18*g* may be formed in the upper release film 18 by the hole-forming jig 23 before the upper release film 18 is held on the upper clamping face. A second work W2 is sucked through the work sucking holes 18*g* of the upper release film 18 and the work drawing holes 14*c* communicated therewith, so that the second work W2 can be held on the upper clamping face.

As shown in FIG. 19A, a first work W1, on which the resin 24 has been supplied, is sucked and held on the lower clamping face, and the second work W2 is sucked and held on the upper clamping face. And then, as shown in FIG. 19B, the molding die set 1 is closed, so that the resin molding can be performed in a state where the resin 24 is sandwiched between the pair of works W1 and W2. For example, semiconductor chips can be exposed on the both side face of a molded product, e.g., package, by removing the release films 12 and 18 (carrier) after the resin molding is performed in the state where the resin 24 is sandwiched between a pair of works for eWLP molding. Therefore, the resin molding can be performed in a state where semiconductor chips are laminated in one package, so that many chips can be included in the package without increasing a package size. Further, a suitable package structure for resin-molding laminated chips, in each of which a plurality of semiconductor chips are laminated, can be realized.

Further, the resin molding may be performed in a state where the work W, on which the chips are mounted as shown in FIGS. 18A-18G, is sucked and held on one of the dies and another work W, which is a functional member, is sucked and held on the other die. A high-value added package can be formed by using a functional member, e.g., heat sink, wiring member for electrically connecting to an external component, optical components such as lens array and polarizing plate, plate for preventing warpage. For example, a package having high optical performance can be produced by resin-molding in a state where optical semiconductor elements are sucked and held on one of the dies and optical members are sucked and held on the other die. Namely, the combination of the works W can be optionally selected, so that versatility of the resin molding apparatus can be improved. Further, the work sucking holes 12*g* are formed into circular holes by the needles 23*c*, but they may be formed like slits or cut crucially.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention has been described in detail, it should be understood that the various changes, substitutions, and alternations could be made hereto without departing from the spirit and scope of the invention.

What is claimed is:

1. A resin molding apparatus for resin-molding one side face of a work in a molding die set, which resin-molds the work in a clamping state and in which the work is sucked and held on at least one of clamping faces and resin-molded in a cavity concave section whose outside dimension is larger than that of the work, said resin molding apparatus, comprising:
the molding die set including a film sucking hole, which is formed in at least one of the clamping faces, a work drawing hole, which is separated from the film sucking hole and which is communicated with a work sucking hole of the release film when the release film is sucked and held, and a cavity concave section, into which resin for molding the work is supplied;
conveying means for conveying the work into the molding die set so as to suck the other side face of the work through the work sucking hole of the release film and hold the work on one of the clamping faces, and taking out a molded product from the molding die set; and
peeling means for peeling the release film, which has stuck on the molded product, from the molded product after the molding die set is opened.

2. The resin molding apparatus according to claim 1, further comprising a guide member for guiding the outer periphery of the work, the guide member being provided in a work mounting face of one of the clamping faces and capable of projecting and retracting from the work mounting face.

3. The resin molding apparatus according to claim 1, further comprising a hole-forming jig having a needle,
wherein the work sucking hole is formed in the release film, which has been sucked and held on one of the clamping faces, by inserting the needle into the work drawing hole.

4. The resin molding apparatus according to claim 3, wherein a guide member is provided to a main body section of the hole-forming jig, and
the guide member includes an extended guide cylinder so as to press the release film and guide the reciprocation of the needle.

5. The resin molding apparatus according to claim 1, wherein the molded product, which is held by an off-loader, is moved away so as to apply tension to the release film which has stuck on the molded product, and
a peeling bar is inserted between the molded product and the release film so as to remove the release film from the molded product.

6. The resin molding apparatus according to claim 1, wherein the release film, which has stuck on the molded product, is removed by a peeling bar, which is moved parallel to the work, in a state where tension is applied to the release film by winding actions of an elongated feed reel and an elongated collecting reel.

7. The resin molding apparatus according to claim 1, wherein the release film, which has stuck on the molded product, is removed from the molded product by moving a peeling chuck holding both side edges of the release film away from the molded product in a state where the molded product is held and lifted from a work mounting face by an off-loader.

8. The resin molding apparatus according to claim 7, further comprising a product receiving table, which is inserted under the work before the release film is removed by the peeling chuck.

* * * * *